United States Patent
Jang et al.

(10) Patent No.: US 12,439,798 B2
(45) Date of Patent: Oct. 7, 2025

(54) DISPLAY DEVICE WITH IMPROVED COLOR FILTER

(71) Applicant: Samsung Display Co., LTD., Yongin-si (KR)

(72) Inventors: Chang Soon Jang, Seoul (KR); In Ok Kim, Osan-si (KR); Chan Su Kim, Asan-si (KR); Gak Seok Lee, Hwaseong-si (KR); Sang Hun Lee, Hwaseong-si (KR); So Yun Lee, Seoul (KR); Ji Eun Jang, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 526 days.

(21) Appl. No.: 17/897,386

(22) Filed: Aug. 29, 2022

(65) Prior Publication Data
US 2023/0165102 A1    May 25, 2023

(30) Foreign Application Priority Data
Nov. 25, 2021   (KR) ........................ 10-2021-0164827

(51) Int. Cl.
| | | |
|---|---|---|
| *H10K 59/38* | (2023.01) | |
| *G02B 5/20* | (2006.01) | |
| *H10K 50/86* | (2023.01) | |
| *H10K 59/122* | (2023.01) | |

(52) U.S. Cl.
CPC .......... *H10K 59/38* (2023.02); *H10K 50/865* (2023.02); *G02B 5/201* (2013.01); *H10K 59/122* (2023.02)

(58) Field of Classification Search
None
See application file for complete search history.

(56) References Cited

U.S. PATENT DOCUMENTS

| | | | |
|---|---|---|---|
| 2015/0226400 A1* | 8/2015 | Wada | H10H 20/856 |
| | | | 362/97.1 |
| 2016/0041430 A1 | 2/2016 | Lee et al. | |
| 2019/0004344 A1* | 1/2019 | Haruyama | G02F 1/133634 |
| 2019/0219875 A1* | 7/2019 | Jung | H10K 50/858 |
| 2019/0296088 A1* | 9/2019 | Kim | H10K 59/877 |
| 2020/0083263 A1* | 3/2020 | Tanaka | H10F 39/802 |
| 2020/0144444 A1* | 5/2020 | Kim | H10H 29/142 |
| 2023/0003927 A1* | 1/2023 | Jiao | H10K 59/38 |
| 2024/0016023 A1* | 1/2024 | Liu | H10K 59/38 |

FOREIGN PATENT DOCUMENTS

KR         10-0657396         12/2006

\* cited by examiner

*Primary Examiner* — Nduka E Ojeh
(74) *Attorney, Agent, or Firm* — CANTOR COLBURN LLP

(57) ABSTRACT

A display device includes display area; a non-display area; a display substrate; and a color conversion substrate disposed on the display substrate, the display substrate includes a first base portion, and a light emitting element disposed in the display area on the first base portion, the color conversion substrate includes a second base portion facing the first base portion, and a color filter layer disposed between the second base portion and the light emitting element, the display area includes a first light emitting area emitting first light, the color filter layer includes a first color filter disposed in the first light emitting area, and the first color filter includes at least two layers.

17 Claims, 22 Drawing Sheets

DISPLAY DEVICE WITH IMPROVED COLOR FILTER

CROSS-REFERENCE TO RELATED APPLICATION(S)

This application claims priority to and benefits of Korean Patent Application No. 10-2021-0164827 under 35 U.S.C. § 119 filed on Nov. 25, 2021 in the Korean Intellectual Property Office, the entire contents of which are incorporated herein by reference.

BACKGROUND

1. Technical Field

The disclosure relates to a display device.

2. Description of the Related Art

The importance of display devices is gradually increasing with the development of multimedia. In response to this, various display devices such as a liquid crystal display device (LCD) and an organic light emitting diode display device (OLED) have been developed.

Among the display devices, a self-light emitting display device may include a self-light emitting element, for example, an organic light emitting element. The self-light emitting element may include two opposing electrodes and an emission layer interposed therebetween. In case that the self-light emitting element is the organic light emitting element, electrons and holes provided from the two electrodes recombine in the emission layer to generate an exciton, the generated exciton changes from an excited state to a ground state, and light may be emitted.

The self-light emitting display device that does not require a light source, such as a backlight unit, has low power consumption and may be lightweight and thin, and may also attract attention as a next-generation display device because of its high quality characteristics such as a wide viewing angle, high luminance and contrast, and a fast response speed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device that reduces specular reflection without degrading color characteristics.

However, aspects of the disclosure are not restricted to those set forth herein. The above and other aspects of the disclosure will become more apparent to one of ordinary skill in the art to which the disclosure pertains by referencing the detailed description of the disclosure given below.

According to an aspect of the disclosure, there is provided a display device, the display device may include a display area; and a non-display area; a display substrate; a color conversion substrate disposed on the display substrate, wherein the display substrate may include a first base portion; and a light emitting element disposed in the display area on the first base portion, the color conversion substrate may include a second base portion facing the first base portion; and a color filter layer disposed between the second base portion and the light emitting element, the display area may include a first light emitting area emitting first light, the color filter layer may include a first color filter disposed in the first light emitting area, and the first color filter may include at least two layers.

The first light may have a peak wavelength in a range of about 610 nm to about 650 nm.

The display area may include a second light emitting area emitting second light; a third light emitting area emitting third light; and a non-light emitting area partitioning the first light emitting area, the second light emitting area, and the third light emitting area.

The second light may have a peak wavelength in a range of about 510 nm to about 550 nm, and the third light may have a peak wavelength in a range of about 440 nm to about 480 nm.

The color filter layer may include a second color filter disposed in the second light emitting area; and a third color filter disposed in the third light emitting area.

The first color filter may include more layers than each of the second color filter and the third color filter.

The first color filter may include a base resin and a colorant dispersed in the base resin.

The at least two layers of the first color filter may include a first layer; and a second layer disposed between the first layer and the second base portion, the first layer and the second layer may be different from each other, the first layer may include the base resin and a first colorant of the colorant dispersed in the base resin, and the second layer may include the base resin and a second colorant of the colorant dispersed in the base resin.

The first colorant may be dispersed in the base resin of the first layer in a first content, the second colorant may be dispersed in the base resin of the second layer in a second content, and the first content may be greater than the second content.

The first content may be in a range of about 25% to about 45%.

The second content may be in a range of about 8% to about 15%.

The first layer may have a first thickness, and the second layer may have a second thickness less than the first thickness of the first layer.

The first thickness may be in a range of about 2000 nm to about 4000 nm.

The second thickness may be in a range of about 500 nm to about 2000 nm.

The color filter layer may include a light blocking pattern overlapping the non-light emitting area, the light blocking pattern may include a first light blocking pattern disposed on a surface of the second base portion; a second light blocking pattern disposed on the first light blocking pattern; and a third light blocking pattern disposed on the second light blocking pattern, the first light blocking pattern and the third color filter may include a same material, the second light blocking pattern and the first layer of the first color filter may include a same material, and the third light blocking pattern and the second color filter may include a same material.

According to another aspect of the disclosure, there is provided a display device, the display device may include a display area; a non-display area; a first substrate; a second substrate disposed on the first substrate, wherein the first substrate may include a first base portion; and a light emitting element disposed in the display area on the first base portion; the second substrate may include a second base portion facing the first base portion; and a color filter layer disposed between the second base portion and the light emitting element, the display area may include a first light emitting area emitting first light, the color filter layer may include a first color filter disposed in the first light emitting area, the first color filter may include at least two layers, the first color filter may include a base resin and a colorant dispersed in the base resin, the at least two layers of the first color filter may include a first layer and a second layer disposed between the first layer and the second base portion, and the first layer and the second layer may be different from each other, and the first layer may have a first refractive index, and the second layer may have a second refractive index smaller than the first refractive index of the first layer.

The second base portion may have a third refractive index, and the second refractive index may be greater than or equal to the third refractive index of the second base portion.

The first refractive index may be in a range of about 1.65 to about 2.0, and the second refractive index may be in a range of about 1.5 to about 1.65.

The second layer may have a transmittance of about 10% or less for a wavelength in a range of about 480 nm to about 580 nm.

The second substrate may include wavelength conversion patterns and a light transmission pattern disposed between the color filter layer and the light emitting element.

Detailed contents of other embodiments are described in a detailed description and are illustrated in the accompanying drawings.

According to embodiments, it is possible to provide a display device that reduces specular reflection without degrading color characteristics.

However, the effects of the embodiments are not restricted to those set forth herein. The above and other effects of the embodiments will become more apparent to one of ordinary skill in the art to which the embodiments pertain by referencing the disclosure and the claims.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
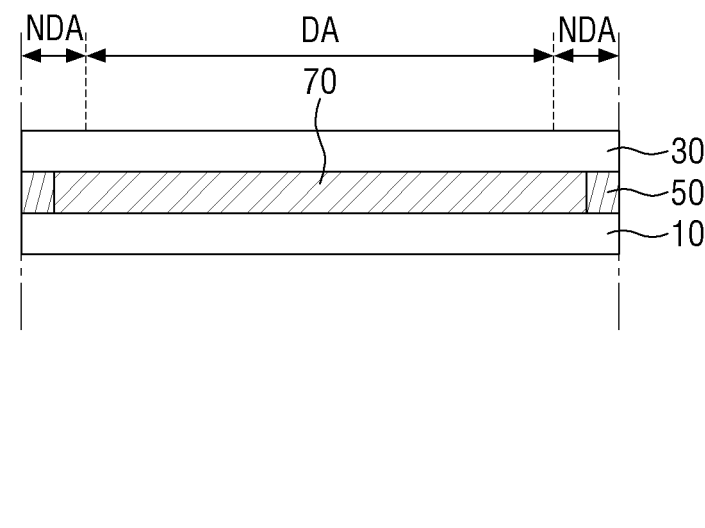
FIG. 1 is a schematic cross-sectional view illustrating a schematic stacked structure of a display device according to an embodiment.

Advantages and features of the disclosure and methods of achieving the same will become apparent with reference to the embodiments described below in detail in conjunction with the accompanying drawings. However, the disclosure is not limited to embodiments to be described below, but may be implemented in various different forms, these embodiments will be provided in order to make the disclosure complete and allow one of ordinary skill in the art to which the disclosure pertains to completely recognize the scope of the disclosure, and the disclosure will also be defined by the scope of the claims.

A phrase "one element or layer 'on' another element or layer" includes both of a case where one element or layer is directly on another element or layer and a case where one element or layer is on another element or layer with the other layer or element interposed therebetween. On the other hand, a phase "one element or layer 'directly on' another element or layer" indicates that one element or layer is on another element or layer without the other layer or element interposed therebetween. Throughout the specification, like reference numerals denote like components.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

Spatially relative terms "below", "beneath", "lower", "above", "upper", and the like, may be used to readily describe correlations between one element or components and another element or components as illustrated in the drawings. The spatially relative terms are to be understood as terms including different directions of the elements in addition to directions illustrated in the drawings. For example, in case that an element illustrated in the drawing is turned over, an element described as being 'below or beneath' of another element may be located 'above' of another element. Therefore, the term 'below' may include both of directions of below and above.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Although the first, second, third, fourth, and the like are used to describe various components, these components are not limited by these terms. These terms are only used to distinguish one component from another. Accordingly, the first component mentioned below may be any one of the second component, the third component, and the fourth component within the spirit of the disclosure.

Embodiments described herein will be described with reference to schematic plan and schematic cross-sectional views, which may be ideal schematic views. Accordingly, the shape of the illustrative drawing may be modified due to manufacturing technology and/or tolerance. Accordingly, the embodiments of the disclosure are not limited to the form illustrated, but also include changes in the form generated according to the manufacturing process. Accordingly, the regions illustrated in the drawings have schematic properties, and the shapes of the regions illustrated in the drawings are intended to illustrate given shapes of regions of the element, and not to limit the scope of the disclosure. For example, in the drawings, sizes, thicknesses, ratios, and dimensions of the elements may be exaggerated for ease of description and for clarity. Like numbers refer to like elements throughout.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

FIG. 1 is a schematic cross-sectional view illustrating a schematic stacked structure of a display device according to an embodiment.

Referring to FIG. 1, a display device 1 may be applied to various electronic devices such as small and medium-sized electronic equipment such as tablet PCs, smartphones, car navigation units, cameras, central information displays (CIDs) provided in automobiles, wristwatch-type electronic devices, personal digital assistants (PDAs), portable multimedia players (PMPs), and game machines, medium and large-sized electronic equipment such as televisions, external billboards, monitors, personal computers, and notebook computers, and the like within the spirit and the scope of the disclosure. These are presented only as examples, and may also be employed in other electronic devices without departing from the disclosure.

The display device 1 may include a display area DA displaying an image and a non-display area NDA that does not display an image. In an embodiment, the non-display area NDA may be located or disposed around the display area DA and surround or be adjacent to the display area DA. An image displayed in the display area DA may be viewed by a user in a direction to which an arrow of the drawing is directed among the third direction Z.

A schematic stacked structure of the display device 1 will be described. In an embodiment, as illustrated in FIG. 1, the display device 1 may include a display substrate 10 and a color conversion substrate 30 facing the display substrate 10, and may further include a sealing member 50 coupling or connecting the display substrate 10 and the color conversion substrate 30, and a filler 70 filled between the display substrate 10 and the color conversion substrate 30.

The display substrate 10 may include a device and circuits for displaying an image, for example, a pixel circuit such as a switching element, a pixel defining layer defining a light emitting area and a non-light emitting area to be described later in the display area DA and a self-light emitting element. In an embodiment, the self-light emitting element may include at least one of an organic light emitting diode, a quantum dot light emitting diode, an inorganic material-based micro light emitting diode (for example, a micro LED), and an inorganic material-based light emitting diode (for example, a nano LED) having a nano size. Hereinafter, for convenience of explanation, a case where the self-light emitting element is an organic light emitting element will be described by way of example.

The color conversion substrate 30 may be positioned on the display substrate 10 and may face the display substrate 10. In an embodiment, the color conversion substrate 30 may include a color conversion pattern for converting a color of incident light. In an embodiment, the color conversion substrate 30 may include at least one of a color filter and a wavelength conversion pattern as the color conversion pattern. In an embodiment, the color conversion substrate 30 may include both the color filter and the wavelength conversion pattern.

A sealing member 50 may be positioned between the display substrate 10 and the color conversion substrate 30 in the non-display area NDA. The sealing member 50 may be disposed along edges of the display substrate 10 and the color conversion substrate 30 in the non-display area NDA to surround the display area DA in a plan view. The display substrate 10 and the color conversion substrate 30 may be coupled or connected to each other through the sealing member 50.

In an embodiment, the sealing member 50 may be made of an organic material. For example, the sealing member 50 may be made of an epoxy-based resin, but is not limited thereto. In other embodiments, the sealing member 50 may also be applied in the form of a frit including glass or the like within the spirit and the scope of the disclosure.

A filler 70 may be positioned in a space between the display substrate 10 and the color conversion substrate 30 surrounded by the sealing member 50. The filler 70 may fill between the display substrate 10 and the color conversion substrate 30.

In an embodiment, the filler 70 may be made of a material that may transmit light. In an embodiment, the filler 70 may be made of an organic material. For example, the filler 70 may be made of a silicone-based organic material, an epoxy-based organic material, or a mixture of a silicone-based organic material and an epoxy-based organic material.

In an embodiment, the filler 70 may be made of a material having an extinction coefficient of substantially zero. There is a correlation between the refractive index and the extinction coefficient, and as the refractive index decreases, the extinction coefficient also decreases. In case that the refractive index is 1.7 or less, the extinction coefficient may substantially converge to zero. In an embodiment, the filler 70 may be made of a material having a refractive index of 1.7 or less, and accordingly, it is possible to prevent or minimize light provided from the self-light emitting element from being absorbed while passing through the filler 70. In an embodiment, the filler 70 may be made of an organic material having a refractive index of 1.4 to 1.6.

Figure 2:
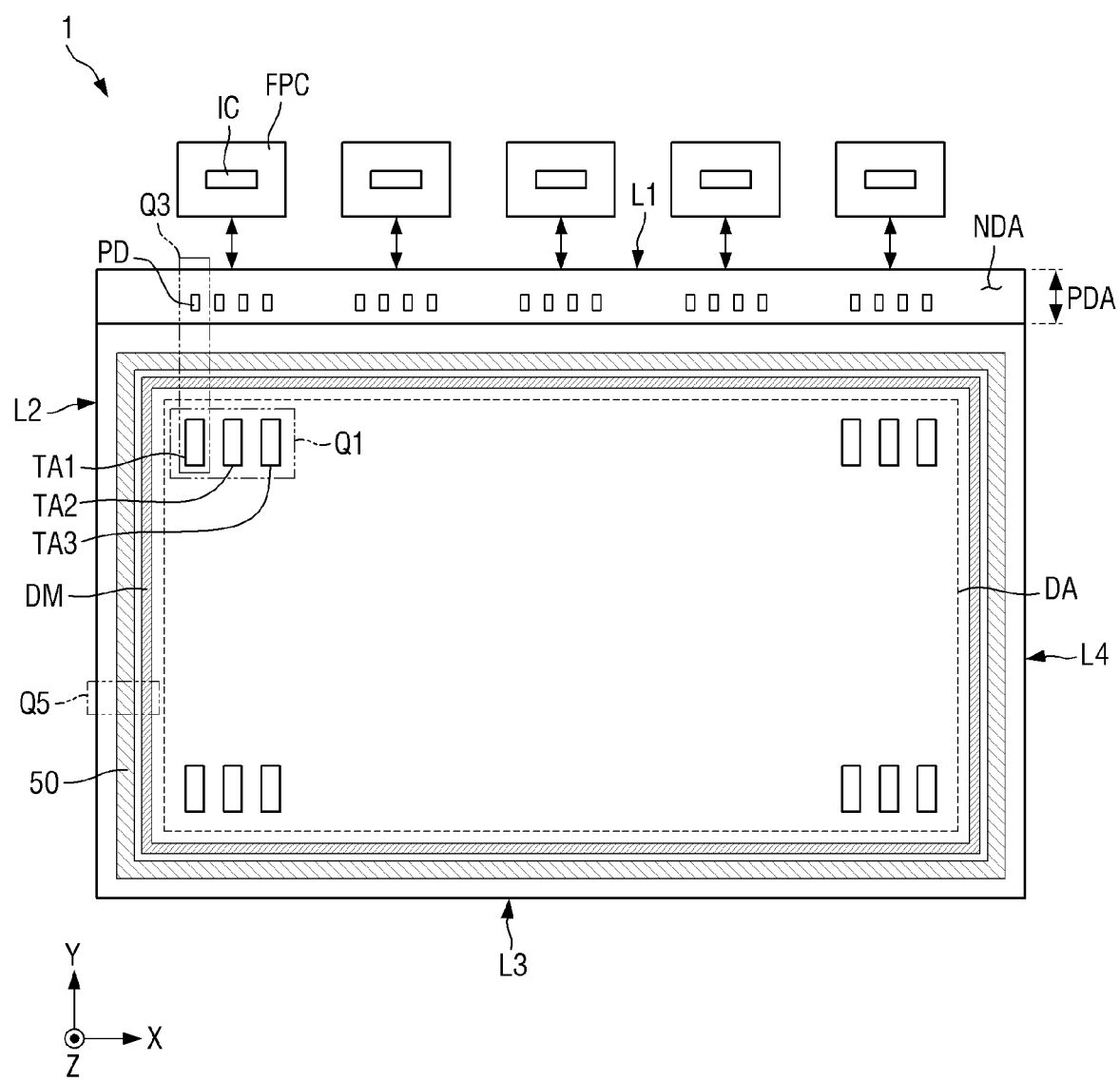
FIG. 2 is a schematic plan view of the display device according to an embodiment.
Figure 3:
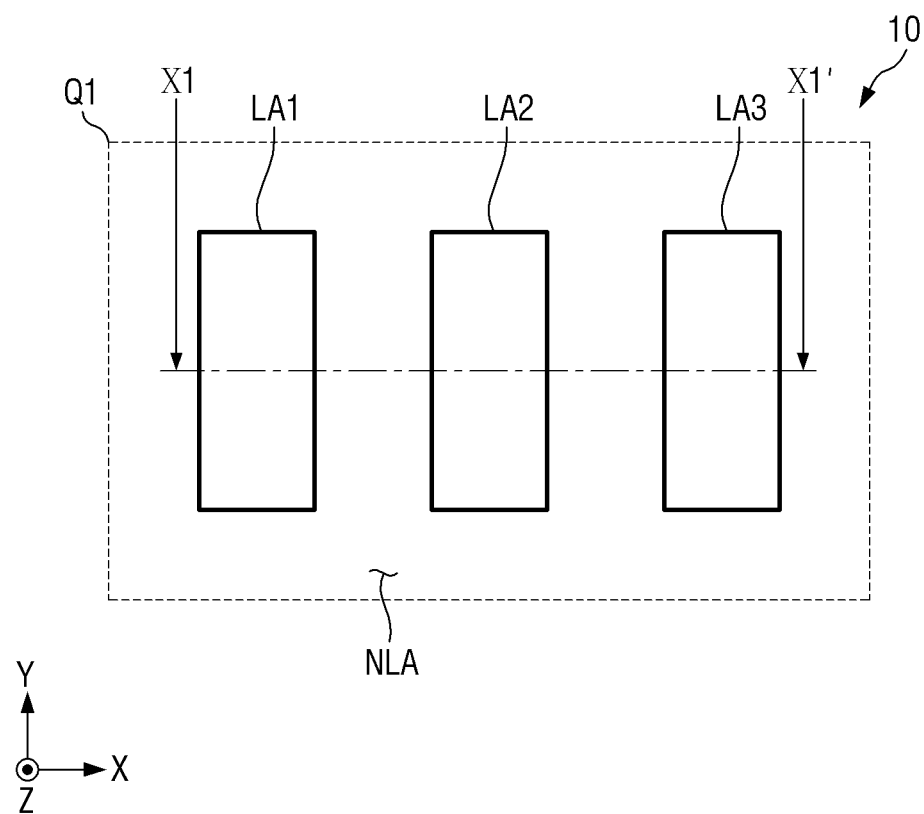
FIG. 3 is an enlarged schematic plan view of a portion Q1 of FIG. 2, and for example, is a schematic plan view of a display substrate included in the display device of FIG. 2.
Figure 4:
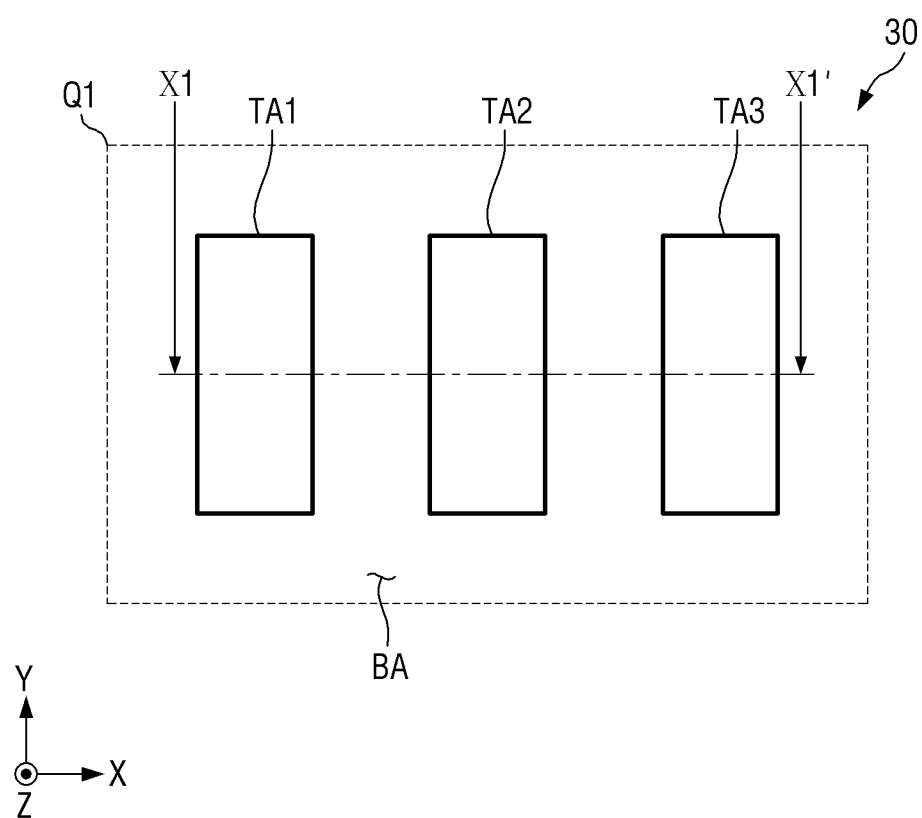
FIG. 4 is an enlarged schematic plan view of a portion Q1 of FIG. 2, and for example, is a schematic plan view of a color conversion substrate included in the display device of FIG. 2.
Figure 5:
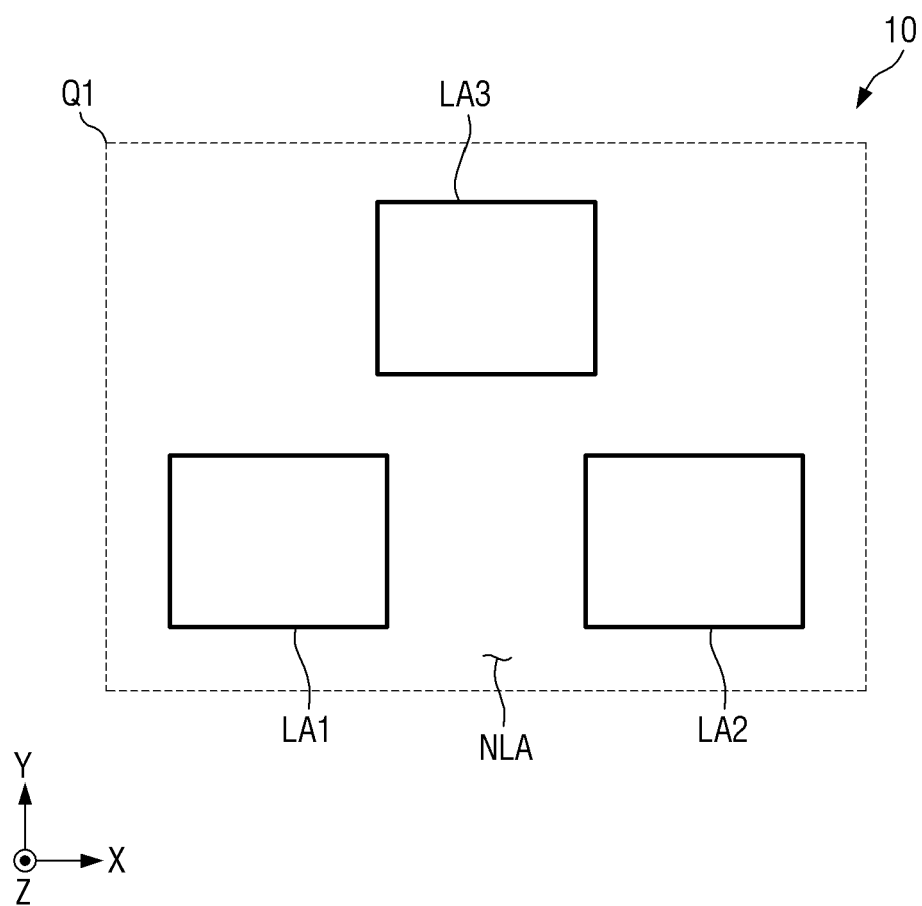
FIG. 5 is a schematic plan view illustrating a modified example of FIG. 3.
Figure 6:
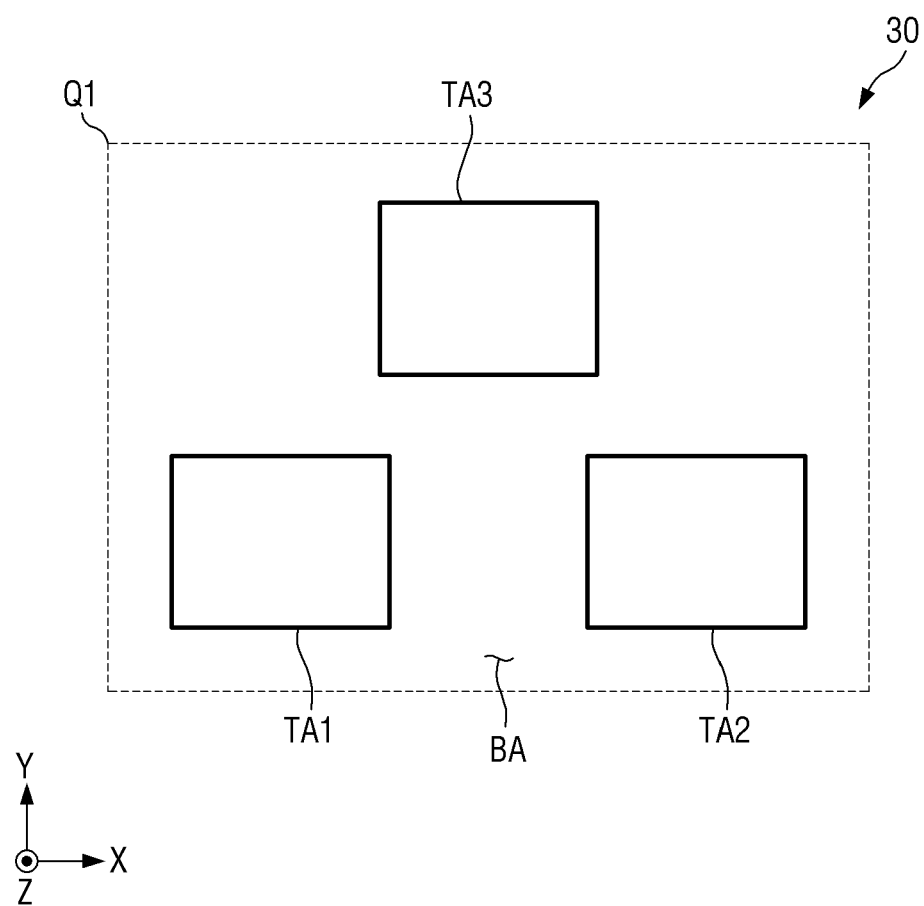
FIG. 6 is a schematic plan view illustrating a modified example of FIG. 4.
Figure 7:
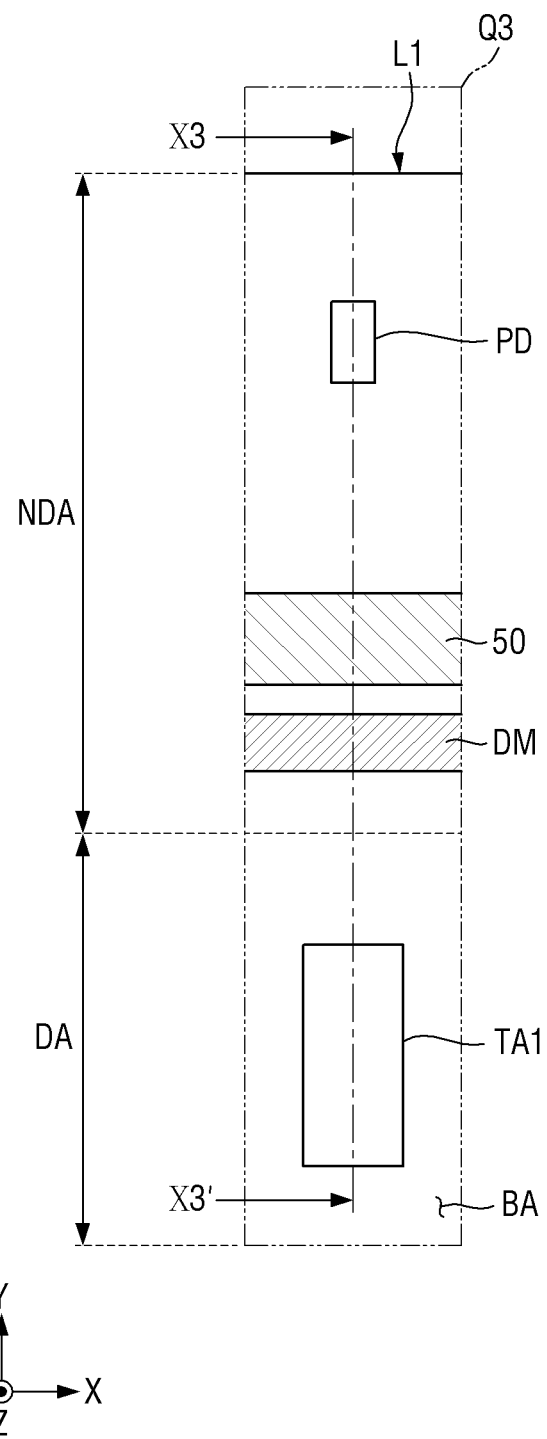
FIG. 7 is an enlarged schematic plan view of a portion Q3 of FIG. 2.
Figure 8:
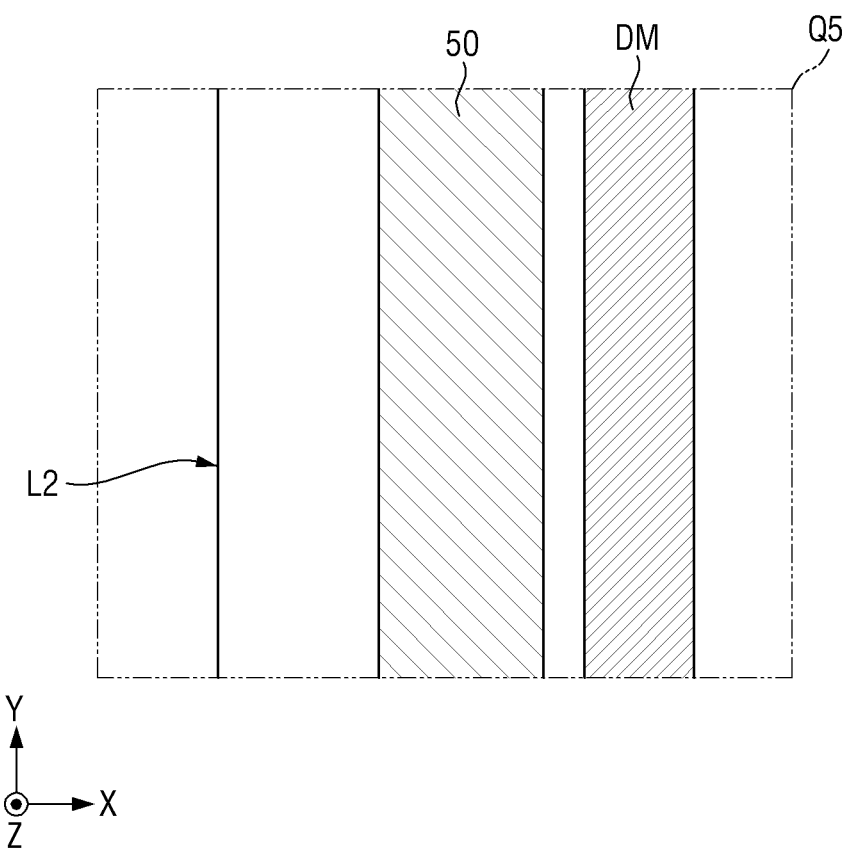
FIG. 8 is an enlarged schematic plan view of a portion Q5 of FIG. 2.

FIG. 2 is a schematic plan view of the display device according to an embodiment, FIG. 3 is an enlarged schematic plan view of a portion Q1 of FIG. 2, and for example, is a schematic plan view of a display substrate included in the display device of FIG. 2, FIG. 4 is an enlarged schematic plan view of a portion Q1 of FIG. 2, and for example, is a schematic plan view of a color conversion substrate included in the display device of FIG. 2, FIG. 5 is a schematic plan view illustrating a modified example of FIG. 3, FIG. 6 is a schematic plan view illustrating a modified example of FIG. 4, FIG. 7 is an enlarged schematic plan view of a portion Q3 of FIG. 2, and FIG. 8 is an enlarged schematic plan view of a portion Q5 of FIG. 2.

Referring further to FIGS. 2 to 8 in addition to FIG. 1, in an embodiment, as illustrated in FIG. 2, the display device 1 may have a rectangular shape in a plan view. The display device 1 may include two first and third sides L1 and L3 extending in a first direction X and two second and fourth sides L2 and L4 extending in a second direction Y intersecting the first direction X. A corner where each side of the display device 1 meets may be a right angle, but is not limited thereto. In an embodiment, the lengths of the first side L1 and the third side L3 and the lengths of the second side L2 and the fourth side L4 may be different from each other. For example, the first side L1 and the third side L3 may be relatively longer than the second side L2 and the fourth side L4. The shape of the display device 1 in a plan view is not limited to the illustrated one, and a circular shape or other shapes may also be applied. It is to be understood that the shapes disclosed herein may also include shapes substantial to those shapes disclosed herein.

In an embodiment, the display device 1 may further include a flexible circuit board (FPC) and a driving chip (IC).

As illustrated in FIG. 3, light emitting areas and a non-light emitting area NLA may be defined in the display substrate 10 in the display area DA.

In an embodiment, a first light emitting area LA1, a second light emitting area LA2, and a third light emitting area LA3 may be defined in the display area DA of the display substrate 10. The first light emitting area LA1, the second light emitting area LA2, and the third light emitting area LA3 may be regions in which light generated by the light emitting element of the display substrate 10 is emitted to the outside of the display substrate 10, and the non-light emitting area NLA may be an area in which light is not emitted to the outside of the display substrate 10. In an embodiment, the non-light emitting area NLA may surround each of the first light emitting area LA1, the second light emitting area LA2, and the third light emitting area LA3 in the display area DA.

In an embodiment, the light emitted to the outside from the first light emitting area LA1, the second light emitting area LA2, and the third light emitting area LA3 may be light of a third color. In an embodiment, the light of the third color may be blue light, and may have a peak wavelength in the range of about 440 nm to about 480 nm. Here, the peak wavelength means a wavelength at which light has a maximum intensity.

In an embodiment, the first light emitting area LA1, the second light emitting area LA2, and the third light emitting area LA3 may form a group, and groups may be defined in the display area DA.

In an embodiment, as illustrated in FIG. 3, the first light emitting area LA1, the second light emitting area LA2, and the third light emitting area LA3 may be sequentially positioned along the first direction X. In an embodiment, the first light emitting area LA1, the second light emitting area LA2, and the third light emitting area LA3 may form a group in the display area DA and may be repeatedly disposed along the first direction X and the second direction Y.

However, the disclosure is not limited thereto, and the arrangement of the first light emitting area LA1, the second light emitting area LA2, and the third light emitting area LA3 may be variously changed. For example, as illustrated in FIG. 5, the first light emitting area LA1 and the second light emitting area LA2 may be adjacent to each other along the first direction X, and the third light emitting area LA3 may be positioned at one side or a side of the first light emitting area LA1 and the second light emitting area LA2 along the second direction Y.

Hereinafter, a case in which the first light emitting area LA1, the second light emitting area LA2, and the third light emitting area LA3 are disposed as illustrated in FIG. 3 will be described as an example.

As illustrated in FIG. 4, light transmitting areas and a light blocking area BA may be defined in the color conversion substrate 30 in the display area DA. The light transmitting areas may be areas in which light emitted from the display substrate 10 penetrates through the color conversion substrate 30 and is provided to the outside of the display device 1. The light blocking area BA may be an area through which light emitted from the display substrate 10 does not penetrate.

In an embodiment, a first light transmitting area TA1, a second light transmitting area TA2, and a third light transmitting area TA3 may be defined in the color conversion substrate 30.

The first light transmitting area TA1 may correspond to or overlap the first light emitting area LA1. Similarly, the second light transmitting area TA2 may correspond to or overlap the second light emitting area LA2, and the third light transmitting area TA3 may correspond to or overlap the third light emitting area LA3.

In an embodiment, in case that the first light emitting area LA1, the second light emitting area LA2, and the third light emitting area LA3 are sequentially positioned along the first direction X as illustrated in FIG. 3, the first light transmitting area TA1, the second light transmitting area TA2, and the third light transmitting area TA3 may also be sequentially positioned along the first direction X as illustrated in FIG. 4.

For example, as illustrated in FIG. 5, in case that the first light emitting area LA1 and the second light emitting area LA2 are adjacent to each other along the first direction X, and the third light emitting area LA3 is positioned at one side or a side of the first light emitting area LA1 and the second light emitting area LA2 along the second direction Y, the first light transmitting area TA1 and the second light transmitting area TA2 may be adjacent to each other along the first direction X, and the third light transmitting area TA3 may be positioned at one side or a side of the first light transmitting area TA1 and the second light transmitting area TA2 along the second direction Y, as illustrated in FIG. 6.

In an embodiment, the light of the third color provided from the display substrate 10 may penetrate through the first light transmitting area TA1, the second light transmitting area TA2, and the third light transmitting area TA3 and be provided to the outside of the display device 1. In case that the light emitted from the first light transmitting area TA1 to the outside of the display device 1 is referred to as first emitted light, the light emitted from the second light transmitting area TA2 to the outside of the display device 1 is referred to as second emitted light, and the light emitted from the third light transmitting area TA3 to the outside of the display device 1 is referred to as third emitted light, the first emitted light may be light of a first color, the second emitted light may be light of a second color different from the first color, and the third emitted light may be the light of the third color. In an embodiment, the light of the third color may be blue light having a peak wavelength in the range of about 440 nm to about 480 nm as described above, and the light of the first color may be red light having a peak wavelength in the range of about 610 nm to about 650 nm. The light of the second color may be green light having a peak wavelength in the range of about 510 nm to about 550 nm.

In the display area DA, the light blocking area BA may be positioned around the first light transmitting area TA1, the second light transmitting area TA2, and the third light transmitting area TA3 of the color conversion substrate 30. In an embodiment, the light blocking area BA may surround the first light transmitting area TA1, the second light transmitting area TA2, and the third light transmitting area TA3. The light blocking area BA may also be positioned in the non-display area NDA of the display device 1.

Referring back to FIG. 2, a dam member DM and a sealing member 50 may be disposed in the non-display area NDA of the display device 1.

The dam member DM may block an organic material (or monomer) from overflowing in a process of forming an encapsulation layer disposed in the display area DA, and accordingly, may prevent the organic material of the encapsulation layer from extending toward an edge of the display device 1.

In an embodiment, the dam member DM may be disposed to completely surround the display area DA in a plan view.

The sealing member 50 may couple or connect the display substrate 10 and the color conversion substrate 30 to each other as described above.

The sealing member 50 may be positioned outside the dam member DM in the non-display area NDA, and may be disposed to completely surround the dam member DM and the display area DA in a plan view.

The non-display area NDA of the display device 1 may include a pad area PDA, and connection pads PD may be positioned in the pad area PDA.

In an embodiment, the connection pad PD may be positioned in a portion adjacent to the long side of the non-display area NDA, for example, in an area adjacent to the first side L1 of the non-display area NDA. The connection pad PD may be electrically connected to a pixel circuit positioned in the display area DA through a connection line or the like within the spirit and the scope of the disclosure.

The display substrate (10 of FIG. 1) of the display device 1 may include the above-described dam member DM and the connection pad PD.

The flexible circuit board FPC may be connected to the connection pad PD. The flexible circuit board FPC may electrically connect the display board (10 of FIG. 1) to a circuit board that provides a signal, power, and the like for driving the display device 1.

The driving chip IC may be electrically connected to the circuit board and the like to receive data and signals. In an embodiment, the driving chip IC may be a data driving chip, and may receive a data control signal and image data from the circuit board, and the like and generate and output a data voltage corresponding to the image data.

In an embodiment, the driving chip IC may be mounted on the flexible circuit board FPC. For example, the driving chip IC may be mounted on the flexible circuit board FPC in the form of a chip on film (COF).

The data voltage provided from the driving chip IC, the power provided from the circuit board, and the like may be transmitted to the pixel circuit of the display substrate (10 of FIG. 1) via the flexible circuit board FPC and the connection pad PD.

Hereinafter, the structure of the display device 1 will be described in more detail.

Figure 9:
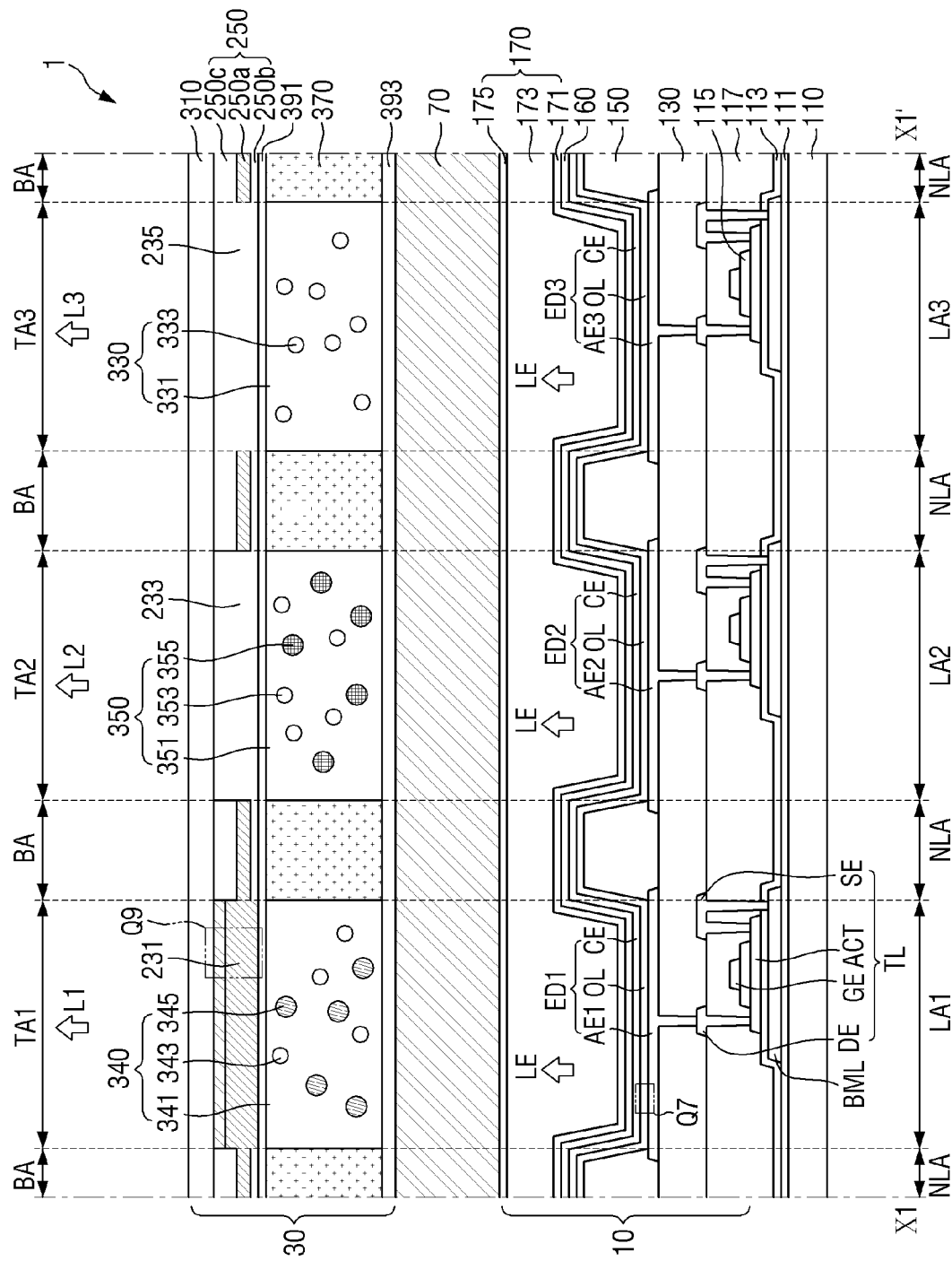
FIG. 9 is a schematic cross-sectional view of a display device according to an embodiment taken along line X1-X1' of FIGS. 3 and 4.
Figure 10:
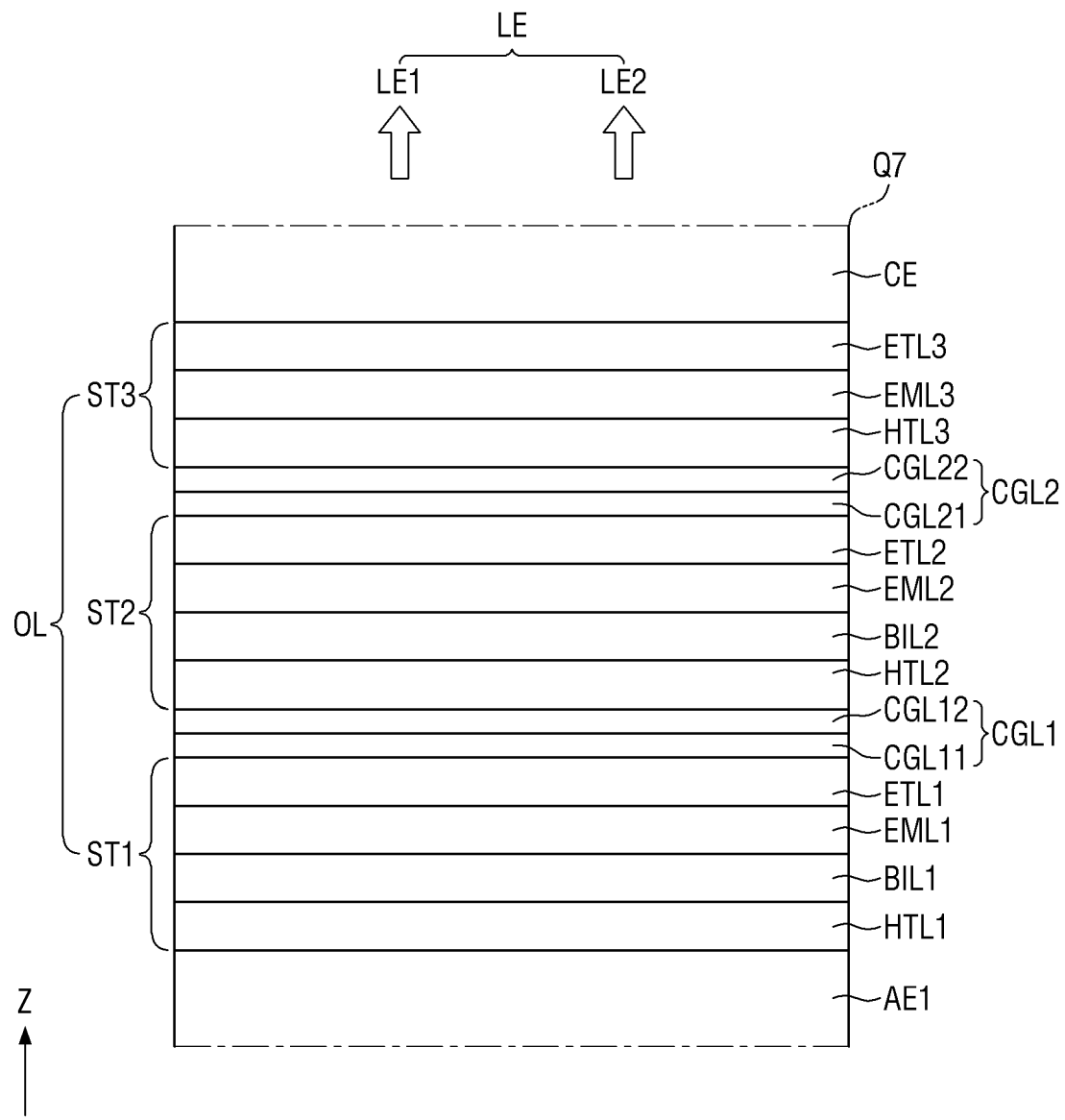
FIG. 10 is an enlarged schematic cross-sectional view of a portion Q7 of FIG. 9.
Figure 11:
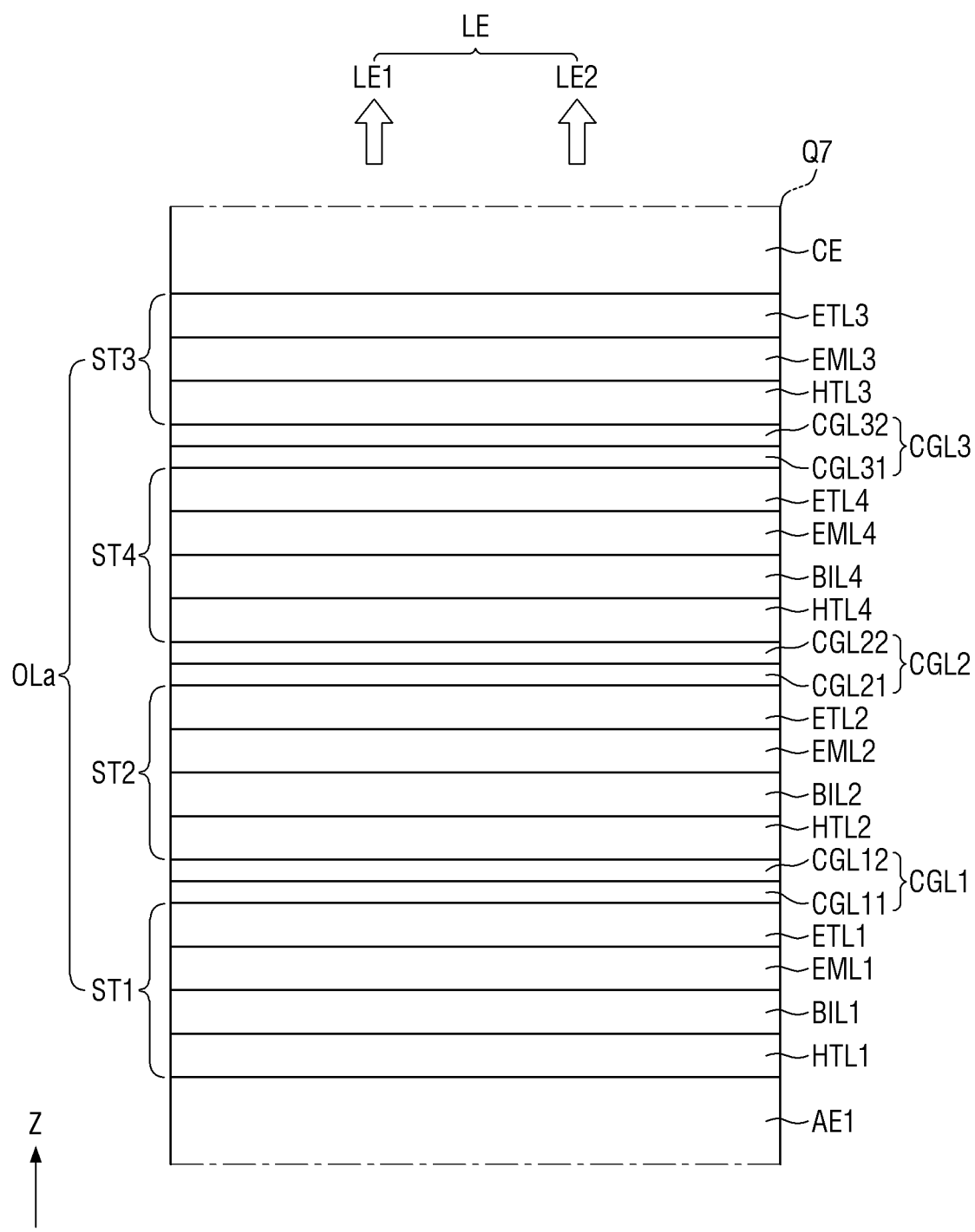
FIG. 11 is a schematic cross-sectional view illustrating a modified example of a structure illustrated in FIG. 10.
Figure 12:
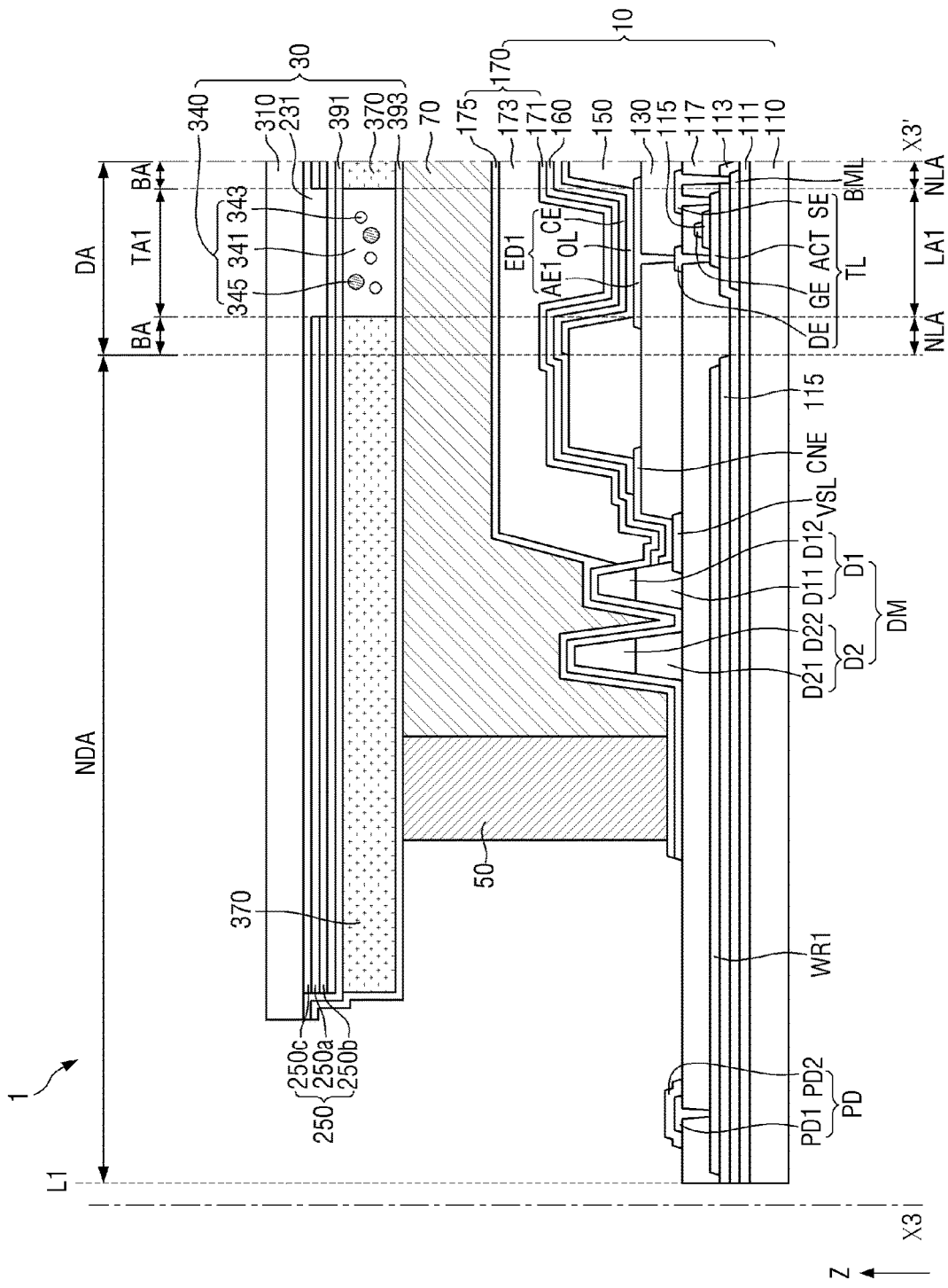
FIG. 12 is a schematic cross-sectional view of a display device according to an embodiment taken along line X3-X3' of FIG. 7.

FIG. 9 is a schematic cross-sectional view of a display device according to an embodiment taken along line X1-X1' of FIGS. 3 and 4. FIG. 10 is an enlarged schematic cross-sectional view of a portion Q7 of FIG. 9. FIG. 11 is a schematic cross-sectional view illustrating a modified example of a structure illustrated in FIG. 10. FIG. 12 is a schematic cross-sectional view of a display device according to an embodiment taken along line X3-X3' of FIG. 7.

Referring further to FIGS. 9 to 12 in addition to FIGS. 1 to 8, the display device 1 may include the display substrate 10 and the color conversion substrate 30 as described above, and may further include the filler 70 positioned between the display substrate 10 and the color conversion substrate 30.

Hereinafter, the display substrate 10 will be described.

A first base portion 110 may be made of a translucent material. In an embodiment, the first base portion 110 may be a glass substrate or a plastic substrate. In case that the first base portion 110 is the plastic substrate, the first base portion 110 may have flexibility.

As described above, in an embodiment, the light emitting areas LA1, LA2, and LA3 and the non-light emitting area NLA may be defined in the first base portion 110 in the display area DA.

In an embodiment, the first side L1, the second side L2, the third side L3, and the fourth side L4 of the display device 1 may be the same as four sides of the first base portion 110. For example, the first side L1, the second side L2, the third side L3, and the fourth side L4 of the display device 1 may also be referred to as a first side L1, a second side L2, a third side L3, and a fourth side L4 of the first base portion 110.

A buffer layer 111 may be further positioned on the first base portion 110. The buffer layer 111 may be disposed on the first base portion 110 and may be disposed in the display area DA and the non-display area NDA. The buffer layer 111 may block foreign substances or moisture penetrating through the first base portion 110. For example, the buffer layer 111 may include an inorganic material such as $SiO_2$, SiNx, or SiON, and may be formed as a single layer or multiple layers.

A lower light blocking layer BML may be positioned on the buffer layer 111. The lower light blocking layer BML may block external light or light from the light emitting element from flowing into a semiconductor layer ACT to be described later, thereby preventing leakage current from being generated by light or reducing the leakage current in a thin film transistor TL to be described later.

In an embodiment, the lower light blocking layer BML may be formed of a material that blocks light and has conductivity. For example, the lower light blocking layer BML may include a single material among metals such as silver (Ag), nickel (Ni), gold (Au), platinum (Pt), aluminum (Al), copper (Cu), molybdenum (Mo), titanium (Ti), and neodymium (Nd), or an alloy thereof. In an embodiment, the lower light blocking layer BML may have a single layer or multilayer structure. For example, in case that the lower light blocking layer BML has the multilayer structure, the lower light blocking layer BML may be a stacked structure of titanium (Ti)/copper (Cu)/indium tin oxide (ITO) or a stacked structure of titanium (Ti)/copper (Cu)/aluminum oxide ($Al_2O_3$), but is not limited thereto.

In an embodiment, lower light blocking layers BML may be provided to correspond to each semiconductor layer ACT and may overlap the semiconductor layer ACT. In an embodiment, a width of the lower light blocking layer BML may be wider than a width of the semiconductor layer ACT.

In an embodiment, the lower light blocking layer BML may be a part of a data line, a power supply line, or a line electrically connecting a thin film transistor (not illustrated) and a thin film transistor TL illustrated in the drawing to each other. In an embodiment, the lower light blocking layer BML may be formed of a material having a lower resistance than a second conductive layer or a source electrode SE and a drain electrode DE included in the second conductive layer.

A first insulating layer 113 may be positioned on the lower light blocking layer BML. In an embodiment, the first insulating layer 113 may be positioned in the display area DA and the non-display area NDA. The first insulating layer 113 may cover or overlap the lower light blocking layer BML. In an embodiment, the first insulating layer 113 may include an inorganic material such as $SiO_2$, SiNx, SiON, $Al_2O_3$, $TiO_2$, $Ta_2O$, $HfO_2$, $ZrO_2$, or the like within the spirit and the scope of the disclosure.

The semiconductor layer ACT may be positioned on the first insulating layer 113. In an embodiment, the semiconductor layer ACT may be disposed to correspond to the first light emitting area LA1, the second light emitting area LA2, and the third light emitting area LA3 in the display area DA, respectively.

In an embodiment, the semiconductor layer ACT may include an oxide semiconductor. For example, the semiconductor layer ACT is a Zn oxide-based material, and may be formed of Zn oxide, In—Zn oxide, Ga—In—Zn oxide, or the like, and may be an In—Ga—Zn—O (IGZO) semiconductor in which ZnO contains metals such as indium (In) and gallium (Ga). However, the semiconductor layer ACT is not limited thereto, and may also include amorphous silicon or polysilicon.

In an embodiment, the semiconductor layer ACT may be disposed to overlap each lower light blocking layer BML, thereby suppressing generation of a photocurrent in the semiconductor layer ACT.

A first conductive layer may be disposed on the semiconductor layer ACT, and the first conductive layer may include a gate electrode GE and a first gate metal WR1. The gate electrode GE may be positioned in the display area DA and may be disposed to overlap the semiconductor layer ACT. As illustrated in FIG. 12, the first gate metal WR1 may include a portion of a line electrically connecting the connection pad (PD of FIG. 2) and the elements positioned in the display area (DA of FIG. 2), for example, the thin film transistor TL and the light emitting element.

The gate electrode GE and the first gate metal WR1 may include one or more of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may be formed of a single layer or multilayer structure, in consideration of adhesiveness with adjacent layers, surface flatness of stacked layers, processability, and the like within the spirit and the scope of the disclosure.

A gate insulating layer 115 may be positioned between the semiconductor layer ACT and the first conductive layer or between the semiconductor layer ACT and the gate electrode GE in the display area DA. In an embodiment, the gate electrode GE and the gate insulating layer 115 may function as a mask for masking a channel region of the semiconductor layer ACT, and the width of the gate electrode GE and the gate insulating layer 115 may be narrower than the width of the semiconductor layer ACT.

In an embodiment, the gate insulating layer 115 may not be formed as a single layer disposed on a front surface of the first base portion 110, but may have a partially patterned shape. In an embodiment, a width of the patterned gate insulating layer 115 may be wider than a width of the gate electrode GE or the first conductive layer.

In an embodiment, the gate insulating layer 115 may include an inorganic material. For example, the gate insulating layer 115 may include the inorganic material as an example in the description of the first insulating layer 113.

In the non-display area NDA, the gate insulating layer 115 may be positioned between the first gate metal WR1 and the first insulating layer 113.

A second insulating layer 117 covering or overlapping the semiconductor layer ACT and the gate electrode GE may be positioned on the gate insulating layer 115. The second insulating layer 117 may be positioned in the display area DA and the non-display area NDA. In an embodiment, the second insulating layer 117 may function as a planarization layer providing a flat surface.

In an embodiment, the second insulating layer 117 may include an organic material. For example, the second insulating layer 117 may include at least one of photo acryl (PAC), polystyrene, polymethyl methacrylate (PMMA), polyacrylonitrile (PAN), polyamide, polyimide, polyaryleether, heterocyclic polymer, parylene, fluorine-based polymer, epoxy resin, benzocyclobutene series resin, siloxane series resin, and silane resin, but is not limited thereto.

The second conductive layer may be positioned on the second insulating layer 117, and the second conductive layer may include a source electrode SE, a drain electrode DE, a voltage supply line VSL, and a first pad electrode PD1 of the connection pad PD.

The source electrode SE and the drain electrode DE may be positioned in the display area DA, and may be disposed to be spaced apart from each other.

The drain electrode DE and the source electrode SE may each penetrate through the second insulating layer 117 and may be connected to the semiconductor layer ACT.

In an embodiment, the source electrode SE may penetrate through the first insulating layer 113 and the second insulating layer 117 and may also be connected to the lower light blocking layer BML. In case that the lower light blocking layer BML is a part of a line that transmits signals or voltages, the source electrode SE may be connected to and electrically coupled or connected to the lower light blocking layer BML to receive a voltage and the like provided to the line. For example, in case that the lower light blocking layer BML is a floating pattern instead of a separate line, a voltage and the like provided to the source electrode SE may be transmitted to the lower light blocking layer BML.

For example, unlike that illustrated in FIG. 9, the drain electrode DE may penetrate through the first insulating layer 113 and the second insulating layer 117 and may also be connected to the lower light blocking layer BML. In case that the lower light blocking layer BML is not a line to which a separate signal is provided, a voltage and the like applied to the drain electrode DE may also be transmitted to the lower light blocking layer BML.

The semiconductor layer ACT, the gate electrode GE, the source electrode SE, and the drain electrode DE described above may form the thin film transistor TL as a switching element. In an embodiment, the thin film transistor TL may be positioned in the first light emitting area LA1, the second light emitting area LA2, and the third light emitting area LA3, respectively. In an embodiment, a portion of the thin film transistor TL may also be positioned in the non-light emitting area NLA.

The voltage supply line VSL may be positioned in the non-display area NDA. A driving voltage provided to the cathode electrode CE, for example, an ELVSS voltage, may be supplied to the voltage supply line VSL.

The first pad electrode PD1 of the connection pad PD may be a pad area (PDA of FIG. 2) of the non-display area NDA. In an embodiment, the first pad electrode PD1 may penetrate through the second insulating layer 117 and may be electrically connected to the first gate metal WR1.

The source electrode SE, the drain electrode DE, the voltage supply line VSL, and the first pad electrode PD1 of the connection pad PD may include aluminum (Al), copper (Cu), titanium (Ti), or the like, and may have a multilayer or single layer structure. In an embodiment, the source electrode SE, the drain electrode DE, the voltage supply line VSL, and the first pad electrode PD1 of the connection pad PD may have a multilayer structure of Ti/Al/Ti.

A third insulating layer 130 may be positioned on the second insulating layer 117. The third insulating layer 130 may cover or overlap the thin film transistor TL in the display area DA, and may expose a portion of the voltage supply line VSL in the non-display area NDA.

In an embodiment, the third insulating layer 130 may be a planarization layer. In an embodiment, the third insulating layer 130 may be made of an organic material. For example, the third insulating layer 130 may include an acrylic resin, an epoxy-based resin, an imide-based resin, an ester-based resin, or the like within the spirit and the scope of the disclosure. In an embodiment, the third insulating layer 130 may include a photosensitive organic material.

A first anode electrode AE1, a second anode electrode AE2, and a third anode electrode AE3 may be positioned on the third insulating layer 130 in the display area DA. A connection electrode CNE and a second pad electrode PD2 of the connection pad PD may be positioned on the third insulating layer 130 in the non-display area NDA.

The first anode electrode AE1 may overlap the first light emitting area LA1 and at least a portion thereof may extend to the non-light emitting area NLA. The second anode electrode AE2 may overlap the second light emitting area LA2 and at least a portion thereof may extend to the non-light emitting area NLA, and the third anode electrode AE3 may overlap the third light emitting area LA3 and at least a portion thereof may extend to the non-light emitting area NLA. The first anode electrode AE1 may penetrate through the third insulating layer 130 and may be connected to the drain electrode DE of the thin film transistor TL corresponding to the first anode electrode AE1, the second anode electrode AE2 may penetrate through the third insulating layer 130 and may be connected to the drain electrode DE of the thin film transistor TL corresponding to the second anode electrode AE2, and the third anode electrode AE3 may penetrate through the third insulating layer 130 and may be connected to the drain electrode DE of the thin film transistor TL corresponding to the third anode electrode AE3.

In an embodiment, the first anode electrode AE1, the second anode electrode AE2, and the third anode electrode AE3 may be reflective electrodes, and the first anode electrode AE1, the second anode electrode AE2, and the third anode electrode AE3 may be a metal layer including a metal such as Ag, Mg, Al, Pt, Pd, Au, Ni, Nd, Ir, and Cr. In an embodiment, the first anode electrode AE1, the second anode electrode AE2, and the third anode electrode AE3 may further include a metal oxide layer stacked on the metal layer. In an embodiment, the first anode electrode AE1, the second anode electrode AE2, and the third anode electrode AE3 may have a multilayer structure, for example, a two-layer structure of ITO/Ag, Ag/ITO, ITO/Mg, or ITO/MgF, or a three-layer structure such as ITO/Ag/ITO.

The connection electrode CNE may be electrically connected to the voltage supply line VSL in the non-display area NDA and may be in direct contact with the voltage supply line VSL.

The second pad electrode PD2 may be positioned on the first pad electrode PD1 in the non-display area NDA. The second pad electrode PD2 may be in direct contact with the first pad electrode PD1 to be electrically connected to the first pad electrode PD1.

In an embodiment, the connection electrode CNE and the second pad electrode PD2 may be made of a same material or a similar material as the first anode electrode AE1, the second anode electrode AE2, and the third anode electrode AE3, and may be formed together during a manufacturing process of the first anode electrode AE1, the second anode electrode AE2, and the third anode electrode AE3.

The pixel defining layer 150 may be positioned on the first anode electrode AE1, the second anode electrode AE2, and the third anode electrode AE3. The pixel defining layer 150 may include an opening exposing the first anode electrode AE1, an opening exposing the second anode electrode AE2, and an opening exposing the third anode electrode AE3, and may define the first light emitting area LA1, the second light emitting area LA2, the third light emitting area LA3, and the non-light emitting area NLA. For example, an area of the first anode electrode AE1 that is not covered or overlapped and is exposed by the pixel defining layer 150 may be the first light emitting area LA1. Similarly, an area of the second anode electrode AE2 that is not covered or overlapped and is exposed by the pixel defining layer 150 may be the second light emitting area LA2, and an area of the third anode electrode AE3 that is not covered or overlapped and is exposed by the pixel defining layer 150 may be the third light emitting area LA3. The area in which the pixel defining layer 150 is positioned may be the non-light emitting area NLA.

In an embodiment, the pixel defining layer 150 may include an organic insulating material such as a polyacrylates resin, an epoxy resin, a phenolic resin, a polyamides resin, a polyimides resin, an unsaturated polyesters resin, a polyphenylenethers resin, a polyphenylenesulfides resin, or benzocyclobutene (BCB).

In an embodiment, the pixel defining layer 150 may overlap a light blocking pattern 250 to be described later. In an embodiment, the pixel defining layer 150 may also overlap a bank pattern 370 to be described later.

As illustrated in FIGS. 9 and 12, a light emitting layer OL may be positioned on the first anode electrode AE1, the second anode electrode AE2, and the third anode electrode AE3.

In an embodiment, the light emitting layer OL may have a continuous film shape formed over the light emitting areas LA1, LA2, and LA3 and the non-light emitting area NLA. Although it is illustrated in the drawings that the light emitting layer OL is positioned only in the display area DA, the disclosure is not limited thereto. In other embodiments, a portion of the light emitting layer OL may be further positioned in the non-display area NDA. A more detailed description of the light emitting layer OL will be described later.

A cathode electrode CE may be positioned on the light emitting layer OL. A portion of the cathode electrode CE may be further positioned in the non-display area NDA. The cathode electrode CE may be electrically connected to the connection electrode CNE and may be in contact with the connection electrode CNE in the non-display area NDA. The driving voltage (for example, ELVSS voltage) provided to the voltage supply line VSL may be transmitted to the cathode electrode CE via the connection electrode CNE.

In an embodiment, the cathode electrode CE may have semi-permeability or permeability. In case that the cathode electrode CE has the semi-permeability, the cathode electrode CE may include Ag, Mg, Cu, Al, Pt, Pd, Au, Ni, Nd, Ir, Cr, Li, Ca, LiF/Ca, LiF/Al, Mo, Ti or a compound or mixture thereof, for example, a mixture of Ag and Mg. In case that the cathode electrode CE has a thickness of several tens to several hundreds of angstroms, the cathode electrode CE may have semi-permeability.

In case that the cathode electrode CE has permeability, the cathode electrode CE may include a transparent conductive oxide (TCO). For example, the cathode electrode CE may include tungsten oxide (WxOx), titanium oxide ($TiO_2$), indium tin oxide (ITO), indium zinc oxide (IZO), zinc oxide (ZnO), indium tin zinc oxide (ITZO), magnesium oxide (MgO), or the like within the spirit and the scope of the disclosure.

In an embodiment, the cathode electrode CE may completely cover or overlap the light emitting layer OL. In an embodiment, as illustrated in FIG. 12, an end portion of the cathode electrode CE may be positioned relatively outside than an end portion of the light emitting layer OL, and the end portion of the light emitting layer OL may be completely covered or overlapped by the cathode electrode CE.

The first anode electrode AE1, the light emitting layer OL, and the cathode electrode CE may constitute a first light emitting device ED1, the second anode electrode AE2, the light emitting layer OL, and the cathode electrode CE may constitute a second light emitting device ED2, and the third anode electrode AE3, the light emitting layer OL, and the cathode electrode CE may constitute a third light emitting device ED3. Each of the first light emitting device ED1, the second light emitting device ED2, and the third light emitting device ED3 may emit emitted light LE.

As illustrated in FIG. 10, the emitted light LE emitted from the light emitting layer OL may be mixed light in which a first component LE1 and a second component LE2 are mixed. A peak wavelength of each of the first component LE1 and the second component LE2 of the emitted light LE may be about 440 nm or more and less than about 480 nm. For example, the emitted light LE may be blue light.

As illustrated in FIG. 10, in an embodiment, the light emitting layer OL may have a structure in which light emitting layers are disposed to overlap, for example, a tandem structure. For example, the light emitting layer OL may include a first stack ST1 including a first light emitting layer EML1, a second stack ST2 positioned on the first stack ST1 and including a second light emitting layer EML2, a third stack ST3 positioned on the second stack ST2 and including a third light emitting layer EML3, a first charge generation layer CGL1 positioned between the first stack ST1 and the second stack ST2, and a second charge generation layer CGL2 positioned between the second stack ST2 and the third stack ST3. The first stack ST1, the second stack ST2, and the third stack ST3 may be disposed to overlap each other.

The first light emitting layer EML1, the second light emitting layer EML2, and the third light emitting layer EML3 may be disposed to overlap each other.

In an embodiment, all of the first light emitting layer EML1, the second light emitting layer EML2, and the third light emitting layer EML3 may emit the light of the first color, for example, the blue light. For example, each of the first light emitting layer EML1, the second light emitting layer EML2, and the third light emitting layer EML3 may be a blue light emitting layer and may include an organic material.

In an embodiment, at least one of the first light emitting layer EML1, the second light emitting layer EML2, and the third light emitting layer EML3 may emit first blue light having a first peak wavelength, and at least another one of the first light emitting layer EML1, the second light emitting layer EML2, and the third light emitting layer EML3 may emit second blue light having a second peak wavelength different from the first peak wavelength. For example, any one of the first light emitting layer EML1, the second light emitting layer EML2, and the third light emitting layer EML3 may emit the first blue light having the first peak wavelength, and the other two of the first light emitting layer EML1, the second light emitting layer EML2, and the third light emitting layer EML3 may emit the second blue light having the second peak wavelength. For example, the emitted light LE emitted from the light emitting layer OL may be a mixed light in which the first component LE1 and the second component LE2 are mixed, and the first component LE1 may be the first blue light having the first peak wavelength, and the second component LE2 may be the second blue light having the second peak wavelength.

In an embodiment, one of the first peak wavelength and the second peak wavelength may have a range of about 440 nm or more and less than about 460 nm, and the other one of the first peak wavelength and the second peak wavelength may have a range of about 460 nm or more and about 480 nm or less. However, the range of the first peak wavelength and the range of the second peak wavelength are not limited thereto. For example, both the range of the first peak wavelength and the range of the second peak wavelength may include about 460 nm. In an embodiment, any one of the first blue light and the second blue light may be light of a deep blue color, and the other one of the first blue light and the second blue light may be light of a sky blue color.

According to an embodiment, the emitted light LE emitted from the light emitting layer OL is blue light and may include a long wavelength component and a short wavelength component. Therefore, the light emitting layer OL may emit blue light having an emission peak that is more widely distributed as the emitted light LE. Through this, there is an advantage in that color visibility may be improved at a side viewing angle compared to a conventional light emitting device emitting blue light having a sharp emission peak.

In an embodiment, each of the first light emitting layer EML1, the second light emitting layer EML2, and the third light emitting layer EML3 may include a host and a dopant. The host is not particularly limited as long as it is a commonly used material, but, for example, Alq3(tris(8-hydroxyquinolino)aluminum), CBP(4,4'-bis(N-carbazolyl)-1,1'-biphenyl), PVK(poly(n-vinylcabazole)), ADN(9,10-di(naphthalene-2-yl)anthracene), TCTA(4,4',4"-Tris(carbazol-9-yl)-triphenylamine), TPBi(1,3,5-tris(N-phenylbenzimidazole-2-yl)benzene), TBADN(3-tert-butyl-9,10-di(naphth-2-yl)anthracene), DSA(di styrylarylene), CDBP(4,4'-bis(9-carbazolyl)-2,2"-dimethyl-biphenyl), MADN(2-Methyl-9,10-bis(naphthalen-2-yl)anthracene), or the like may be used.

Each of the first light emitting layer EML1, the second light emitting layer EML2, and the third light emitting layer EML3 emitting blue light may include a fluorescent material including any one selected from the group consisting of, for example, spiro-DPVBi, spiro-6P, distyryl-benzene (DSB), distyryl-arylene (DSA), polyfluorene (PFO)-based polymers, and poly (p-phenylene vinylene) (PPV)-based polymers. As another example, each of the first light emitting layer EML1, the second light emitting layer EML2, and the third light emitting layer EML3 may also include a phosphorescent material containing an organometallic complex such as (4,6-F2ppy)2Irpic.

As described above, at least one of the first light emitting layer EML1, the second light emitting layer EML2, and the third light emitting layer EML3 emits blue light in a wavelength band different from that of the other one of the first light emitting layer EML1, the second light emitting layer EML2, and the third light emitting layer EML3. In order to emit blue light in different wavelength bands, the first light emitting layer EML1, the second light emitting layer EML2, and the third light emitting layer EML3 may include a same material or a similar material, and a method of adjusting a resonance distance may be used. For example, in order to emit blue light in different wavelength bands, at least one of the first light emitting layer EML1, the second light emitting layer EML2, and the third light emitting layer EML3 and the other one of the first light emitting layer EML1, the second light emitting layer EML2, and the third light emitting layer EML3 may also include different materials.

However, the first light emitting layer EML1, the second light emitting layer EML2, and the third light emitting layer EML3 are not limited thereto, and the blue light emitted from each of the first light emitting layer EML1, the second light emitting layer EML2, and the third light emitting layer EML3 may also have a peak wavelength in a range of about 440 nm to about 480 nm, and the first light emitting layer EML1, the second light emitting layer EML2, and the third light emitting layer EML3 may also be made of a same material or a similar material.

For example, in an embodiment, at least one of the first light emitting layer EML1, the second light emitting layer EML2, and the third light emitting layer EML3 may emit the first blue light having the first peak wavelength, another of the first light emitting layer EML1, the second light emitting layer EML2, and the third light emitting layer EML3 may emit second blue light having a second peak wavelength different from the first peak wavelength, and the other one of the first light emitting layer EML1, the second light emitting layer EML2, and the third light emitting EML3 may emit third blue light having a third peak wavelength different from the first peak wavelength and the second peak wavelength. In other embodiments, any one of the first peak wavelength, the second peak wavelength, and the third peak wavelength may have the range of about 440 nm or more and less than about 460 nm. Another of the first peak wavelength, the second peak wavelength, and the third peak wavelength may have the range of about 460 nm or more and less than about 470 nm, and the other of the first peak wavelength, the second peak wavelength, and the third peak wavelength may also have the range of about 470 nm or more and about 480 nm or less.

According to other embodiments, the emitted light LE emitted from the light emitting layer OL is blue light and may include a long wavelength component, an intermediate wavelength component, and a short wavelength component. Therefore, the light emitting layer OL may emit blue light having an emission peak that is more widely distributed as the emitted light LE, and may improve color visibility at a side viewing angle.

According to embodiments described above, compared to a conventional light emitting device that does not employ a tandem structure, for example, a structure in which light emitting layers may be stacked, each other there are advantages of increasing light efficiency and improving the lifespan of the display device.

For example, in other embodiments, at least one of the first light emitting layer EML1, the second light emitting layer EML2, and the third light emitting layer EML3 may emit light of the third color, for example, blue light, and at least the other one of the first light emitting layer EML1, the second light emitting layer EML2, and the third light emitting layer EML3 may emit light of the second color, for example, green light. In other embodiments, the peak wavelength of the blue light emitted by at least one of the first light emitting layer EML1, the second light emitting layer EML2, and the third light emitting layer EML3 may have the range of about 440 nm or more to about 480 nm or less, or about 460 nm or more to about 480 nm or less. The green light emitted from at least the other one of the first light emitting layer EML1, the second light emitting layer EML2, and the third light emitting layer EML3 may have a peak wavelength in the range of about 510 nm to about 550 nm.

For example, any one of the first light emitting layer EML1, the second light emitting layer EML2, and the third light emitting layer EML3 may be a green light emitting layer emitting green light, and the other two of the first light emitting layer EML1, the second light emitting layer EML2, and the third light emitting layer EML3 may be a blue light emitting layer emitting blue light. In case that the other two of the first light emitting layer EML1, the second light emitting layer EML2, and the third light emitting layer EML3 are the blue light emitting layers, the peak wavelength ranges of the blue light emitted by the two blue light emitting layers may be the same, and the peak wavelength ranges of the blue light emitted by the two blue light emitting layers may be different from each other.

According to other embodiments, the emitted light LE emitted from the light emitting layer OL may be mixed light in which a first component LE1 that is blue light and a second component LE2 that is green light are mixed. For example, in case that the first component LE1 is dark blue light and the second component LE2 is green light, the emitted light LE may be light having a sky blue color. Similar to embodiments described above, the emitted light LE emitted from the light emitting layer OL is mixed light of blue light and green light, and may include a long wavelength component and a short wavelength component. Therefore, the light emitting layer OL may emit blue light having an emission peak that is more widely distributed as the emitted light LE, and may improve color visibility at a side viewing angle. Since the second component LE2 of the emitted light LE is green light, it is possible to supplement the green light component among the light externally provided from the display device 1, and thus the color reproducibility of the display device 1 may be improved.

In other embodiments, a green light emitting layer among the first light emitting layer EML1, the second light emitting layer EML2, and the third light emitting layer EML3 may include a host and a dopant. The host included in the green light emitting layer is not particularly limited as long as it is a commonly used material, but, for example, Alq3 (tris(8-hydroxyquinolino)aluminum), CBP(4,4'-bis(N-carbazolyl)-1,1'-biphenyl), PVK(poly(n-vinylcabazole)), ADN(9,10-di (naphthalene-2-yl)anthracene), TCTA(4,4',4"-Tris(carbazol-9-yl)-triphenylamine), TPBi(1,3,5-tris(N-phenylbenzimidazole-2-yl)benzene), TBADN(3-tert-butyl-9,10-di(naphth-2-yl)anthracene), DSA(distyrylarylene), CDBP(4,4'-bis(9-carbazolyl)-2,2"-dimethyl-biphenyl), MADN(2-Methyl-9,10-bis(naphthalen-2-yl)anthracene), or the like may be used.

The dopant included in the green light emitting layer may be, for example, a fluorescent material including Alq3 (tris-(8-hydroyquinolato) aluminum(III)), or Ir(ppy)3(fac tris(2-phenylpyridine)iridium), Ir(ppy)2(acac)(Bis(2-phenylpyridine)(acetylacetonate)iridium(III)), Ir(mpyp)3(2-phenyl-4-methyl-pyridine iridium), or the like as a phosphorescent material.

The first charge generation layer CGL1 may be positioned between the first stack ST1 and the second stack ST2. The first charge generation layer CGL1 may serve to inject charges into each light emitting layer. The first charge generation layer CGL1 may serve to adjust a charge balance between the first stack ST1 and the second stack ST2. The first charge generation layer CGL1 may include an n-type charge generation layer CGL11 and a p-type charge generation layer CGL12. The p-type charge generation layer CGL12 may be disposed on the n-type charge generation layer CGL11, and may be positioned between the n-type charge generation layer CGL11 and the second stack ST2.

The first charge generation layer CGL1 may have a structure in which the n-type charge generation layer CGL11 and the p-type charge generation layer CGL12 are bonded to each other. The n-type charge generation layer CGL11 is disposed closer to the anode electrodes AE1, AE2, and AE3 among the anode electrodes AE1, AE2, and AE3 and the cathode electrode CE. The p-type charge generation layer CGL12 is disposed closer to the cathode electrode CE among the anode electrodes AE1, AE2, and AE3 and the cathode electrode CE. The n-type charge generation layer CGL11 supplies electrons to the first light emitting layer EML1 adjacent to the anode electrodes AE1, AE2, and AE3, and the p-type charge generation layer CGL12 supplies holes to the second light emitting layer EML2 included in the second stack ST2. The first charge generation layer CGL1 may be disposed between the first stack ST1 and the second stack ST2 to provide charges to each of the light emitting layers, thereby increasing luminous efficiency and lowering a driving voltage.

The first stack ST1 may be positioned on the first anode electrode AE1, the second anode electrode AE2, and the third anode electrode AE3, and may further include a first hole transport layer HTL1, a first electron block layer BIL1, and a first electron transport layer ETL1.

The first hole transport layer HTL1 may be positioned on the first anode electrode AE1, the second anode electrode AE2, and the third anode electrode AE3. The first hole transport layer HTL1 serves to smoothly transport holes and may include a hole transport material. The hole transport material may include carbazole-based derivatives such as N-phenylcarbazole and polyvinylcarbazole; fluorene-based derivatives, triphenylamine-based derivatives such as TPD (N,N'-bis(3-methylphenyl)-N,N'-diphenyl-[1,1-biphenyl]-4,4'-diamine), TCTA(4,4',4"-tris(N-carbazolyl)triphenylamine), or the like, NPB(N,N'-di(1-naphthyl)-N,N'-diphenylbenzidine), TAPC(4,4'-Cyclohexylidene bis[N,N-bis(4-methylphenyl)benzenamine]), or the like, but, is not limited thereto.

The first electron block layer BIL1 may be positioned on the first hole transport layer HTL1, and may be positioned between the first hole transport layer HTL1 and the first light emitting layer EML1. The first electron blocking layer BIL1 may include a hole transport material and a metal or a metal compound to prevent electrons generated in the first light emitting layer EML1 from flowing into the first hole transport layer HTL1. In an embodiment, the first hole transport layer HTL1 and first electron block layer BIL1 that are described above may also be formed of a single layer in which the respective materials are mixed.

The first electron transport layer ETL1 may be positioned on the first light emitting layer EML1, and may be positioned between the first charge generation layer CGL1 and the first light emitting layer EML1. In an embodiment, the first electron transport layer ETL1 may include an electron transport material such as Alq3 (Tris(8-hydroxyquinolinato) aluminum), TPBi(1,3,5-Tri(1-phenyl-1H-benzo[d]imidazol-2-yl)phenyl), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato) aluminum), Bebq2(berylliumbis(benzoquinolin-10-olate), ADN(9,10-di(naphthalene-2-yl)anthracene), and mixtures thereof. However, the disclosure is not limited to the type of the electron transport material. The second stack ST2 may be positioned on the first charge generation layer CGL1 and may further include a second hole transport layer HTL2, a second electron block layer BIL2, and a second electron transport layer ETL2.

The second hole transport layer HTL2 may be positioned on the first charge generation layer CGL1. The second hole transport layer HTL2 may be made of a same material or a similar material as the first hole transport layer HTL1, or may also include one or more materials selected from the materials for example as the material included in the first hole transport layer HTL1. The second hole transport layer HTL2 may be made of a single layer or layers.

The second electron block layer BIL2 may be positioned on the second hole transport layer HTL2, and may be positioned between the second hole transport layer HTL2 and the second light emitting layer EML2. The second electron block layer BIL2 may be made of a same material or a similar material and a same structure as the first electron block layer BIL1, or may also include one or more materials selected from the materials as an example as the material included in the first electron block layer BIL1.

The second electron transport layer ETL2 may be positioned on the second light emitting layer EML2, and may be positioned between the second charge generation layer CGL2 and the second light emitting layer EML2. The second electron transport layer ETL2 may be made of a same material or a similar material and a same structure as the first electron transport layer ETL1, or may also include one or more materials selected from the materials as an example as the material included in the first electron transport layer ETL1. The second electron transport layer ETL2 may be made of a single layer or layers.

The second charge generation layer CGL2 may be positioned on the second stack ST2 and positioned between the second stack ST2 and the third stack ST3.

The second charge generation layer CGL2 may have a same structure as the first charge generation layer CGL1 described above. For example, the second charge generation layer CGL2 may include an n-type charge generation layer CGL21 disposed closer to the second stack ST2 and a p-type charge generation layer CGL22 disposed closer to the cathode electrode CE. The p-type charge generation layer CGL22 may be disposed on the n-type charge generation layer CGL21.

The second charge generation layer CGL2 may have a structure in which the n-type charge generation layer CGL21 and the p-type charge generation layer CGL22 are bonded to each other. The first charge generation layer CGL1 and the second charge generation layer CGL2 may also be made of different materials, and may also be made of a same material or a similar material.

The second stack ST2 may be positioned on the second charge generation layer CGL2 and may further include a third hole transport layer HTL3 and a third electron transport layer ETL3.

The third hole transport layer HTL3 may be disposed on the second charge generation layer CGL2. The third hole transport layer HTL3 may be made of a same material or a similar material as the first hole transport layer HTL1, or may also include one or more materials selected from the materials as an example as the material included in the first hole transport layer HTL1. The third hole transport layer HTL3 may be made of a single layer or layers. In case that the third hole transport layer HTL3 is made of layers, each layer may also include different materials.

The third electron transport layer ETL3 may be disposed on the third light emitting layer EML3, and may be positioned between the cathode electrode CE and the third light emitting layer EML3. The third electron transport layer ETL3 may be made of a same material or a similar material and a same structure as the first electron transport layer ETL1, or may also include one or more materials selected from the materials as an example as the material included in the first electron transport layer ETL1. The third electron transport layer ETL3 may be made of a single layer or layers. In case that the third electron transport layer ETL3 is made of layers, each layer may also include different materials.

Although not illustrated in the drawings, a hole injection layer may be further positioned in at least one of between the first stack ST1 and the first anode electrode AE1, the second anode electrode AE2, and the third anode electrode AE3, between the second stack ST2 and the first charge generation layer CGL1, and between the third stack ST3 and the second charge generation layer CGL2, respectively. The hole injection layer may serve to more smoothly inject holes into the first light emitting layer EML1, the second light emitting layer EML2, and the third light emitting layer EML3. In an embodiment, the hole injection layer may be made of one or more selected from the group consisting of CuPc (cupper phthalocyanine), PEDOT (poly(3,4)-ethylenedioxythiophene), PANI (polyaniline), and NPD (N,N-dinaphthyl-N, N'-diphenyl benzidine), but is not limited thereto. In an embodiment, the hole injection layer may be positioned between the first stack ST1 and the first anode electrode AE1, the second anode electrode AE2, and the third anode electrode AE3, between the second stack ST2 and the first charge generation layer CGL1, and between the third stack ST3 and the second charge generation layer CGL2, respectively.

Although not illustrated in the drawings, an electron injection layer may also be further positioned in at least one of between the third electron transport layer ETL3 and the cathode electrode CE, between the second charge generation layer CGL2 and the second stack ST2, and between the first charge generation layer CGL1 and the first stack ST1. The electron injection layer serves to smoothly inject electrons, and may include, but is not limited to, Alq3 (tris(8-hydroxyquinolino)aluminum), PBD, TAZ, Spiro-PBD, BAlq, or SAlq. The electron injection layer may be a metal halide compound, and may be, for example, at least one selected from the group consisting of $MgF_2$, LiF, NaF, KF, RbF, CsF, FrF, LiI, NaI, KI, RbI, CsI, FrI, and $CaF_2$, but is not limited thereto. The electron injection layer may also include a lanthanide-based material such as Yb, Sm, or Eu. For example, the electron injection layer may simultaneously include a metal halide material and a lanthanide-based material such as RbI:Yb, KI:Yb, and the like within the spirit and the scope of the disclosure. In case that the electron injection layer may include both the metal halide material and the lanthanide-based material, the electron injection layer may be formed by co-deposition of the metal halide material and the lanthanide-based material. In an embodiment, the electron injection layer may also be positioned between the third electron transport layer ETL3 and the cathode electrode CE, between the second charge generation layer CGL2 and the second stack ST2, and between the first charge generation layer CGL1 and the first stack ST1, respectively.

In addition to the above-described structure, the structure of the light emitting layer OL may be modified. For example, the light emitting layer OL may be deformed like a light emitting layer OLa illustrated in FIG. 11. The light emitting layer OLa illustrated in FIG. 11 may further include a fourth stack ST4 positioned between the third stack ST3 and the second stack ST2, unlike the structure illustrated in FIG. 10, and may further include a third charge generation layer CGL3 positioned between the third stack ST3 and the second stack ST2.

The fourth stack ST4 may include a fourth light emitting layer EML4, and may further include a fourth hole transport layer HTL4, a third electron block layer BIL3, and a fourth electron transport layer ETL4.

The first light emitting layer EML1, the second light emitting layer EML2, the third light emitting layer EML3, and the fourth light emitting layer EML4 included in the light emitting layer OL may each emit the light of the first color, for example, the blue light. At least one of the first light emitting layer EML1, the second light emitting layer EML2, the third light emitting layer EML3, and the fourth light emitting layer EML4, and at least another one of the first light emitting layer EML1, the second light emitting layer EML2, the third light emitting layer EML3, and the fourth light emitting layer EML4 may emit blue light having different peak wavelength ranges.

For example, at least one of the first light emitting layer EML1, the second light emitting layer EML2, the third light emitting layer EML3, and the fourth light emitting layer EML4 may emit green light, and at least another one of the first light emitting layer EML1, the second light emitting layer EML2, the third light emitting layer EML3, and the fourth light emitting layer EML4 may also emit blue light. For example, any one of the first light emitting layer EML1, the second light emitting layer EML2, the third light emitting layer EML3, and the fourth light emitting layer EML4 may be a green light emitting layer, and all of the other three light emitting layers may be a blue light emitting layer.

The fourth hole transport layer HTL4 may be positioned on the second charge generation layer CGL2. The fourth hole transport layer HTL4 may be made of a same material or a similar material as the first hole transport layer HTL1, or may also include one or more materials selected from the materials as an example as the material included in the first hole transport layer HTL1. The fourth hole transport layer HTL4 may be made of a single layer or layers. In case that the fourth hole transport layer HTL4 is made of layers, each layer may also include different materials.

The third electron block layer BIL3 may be positioned on the fourth hole transport layer HTL4, and may be positioned between the fourth hole transport layer HTL4 and the fourth light emitting layer EML4. The third electron block layer BIL3 may be made of a same material or a similar material and a same structure as the first electron block layer BIL1 or may also include one or more materials selected from the materials as an example as the material included in the first electron block layer BIL1 In other embodiments, the third electron block layer BIL3 may also be omitted.

The fourth electron transport layer ETL4 may be positioned on the fourth light emitting layer EML4, and may be positioned between the third charge generation layer CGL3 and the fourth light emitting layer EML4. The fourth electron transport layer ETL4 may be made of a same material or a similar material and a same structure as the first electron transport layer ETL1, or may also include one or more materials selected from the materials as an example as the material included in the first electron transport layer ETL1. The fourth electron transport layer ETL4 may be made of a single layer or layers. In case that the fourth electron transport layer ETL4 is made of layers, each layer may also include different materials.

The third charge generation layer CGL3 may have a same structure as the first charge generation layer CGL1 described above. For example, the third charge generation layer CGL3 may include an n-type charge generation layer CGL31 disposed closer to the second stack ST2 and a p-type charge generation layer CGL32 disposed closer to the cathode electrode CE. The p-type charge generation layer CGL32 may be disposed on the n-type charge generation layer CGL31.

Although not illustrated in the drawings, the electron injection layer may be further positioned between the fourth stack ST4 and the third charge generation layer CGL3. The hole injection layer may be further positioned between the fourth stack ST4 and the second charge generation layer CGL2.

In an embodiment, the light emitting layer OL illustrated in FIG. 10 and the light emitting layer OLa illustrated in FIG. 11 may not include a red light emitting layer in common, and thus may not emit the light of the first color, for example, the red light. For example, the emitted light LE may not include a light component having a peak wavelength in a range of about 610 nm to about 650 nm, and the emitted light LE may include only a light component having a peak wavelength in a range of about 440 nm to about 550 nm.

As illustrated in FIG. 12, a dam member DM may be positioned on the second insulating layer 117 in the non-display area NDA.

The dam member DM may be positioned relatively outside as compared to the voltage supply line VSL. In other words, as illustrated in FIG. 12, the voltage supply line VSL may be positioned between the dam member DM and the display area DA.

In an embodiment, the dam member DM may include dams. For example, the dam member DM may include dams. For example, the dam member DM may include a first dam D1 and a second dam D2.

The first dam D1 may partially overlap the voltage supply line VSL and may be spaced apart from the third insulating layer 130 with the voltage supply line VSL interposed therebetween. In an embodiment, the first dam D1 may include a first lower dam pattern D11 positioned on the second insulating layer 117 and a first upper dam pattern D12 positioned on the first lower dam pattern D11.

The second dam D2 may be positioned outside the first dam D1 and may be spaced apart from the first dam D1. In an embodiment, the second dam D2 may include a second lower dam pattern D21 positioned on the second insulating layer 117 and a second upper dam pattern D22 positioned on the second lower dam pattern D21.

In an embodiment, the first lower dam pattern D11 and the second lower dam pattern D21 may be made of a same material or a similar material as the third insulating layer 130 and may be formed simultaneously with the third insulating layer 130.

In an embodiment, the first upper dam pattern D12 and the second upper dam pattern D22 may be made of a same material or a similar material as the pixel defining layer 150 and may be formed simultaneously with the pixel defining layer 150.

In an embodiment, the first dam D1 and the second dam D2 may have different heights. For example, the height of the second dam D2 may be higher than the height of the first dam D1. For example, as a distance from the display area DA increases, the height of the dam included in the dam member DM may gradually increase, and accordingly, in a process of forming an organic layer 173 included in an encapsulation layer 170 to be described later, it is possible to more effectively block the overflow of organic materials.

As illustrated in FIGS. 9 and 12, a first capping layer 160 may be positioned on the cathode electrode CE. The first capping layer 160 may be disposed in common in the first light emitting area LA1, the second light emitting area LA2, the third light emitting area LA3, and the non-light emitting area NLA, and may improve viewing angle characteristics and increase external light emission efficiency.

The first capping layer 160 may include at least one of an inorganic material and an organic material having light transmittance. For example, the first capping layer 160 may be formed of an inorganic layer, or may be formed of an organic layer, and may also be formed of an organic layer including inorganic particles. For example, the first capping layer 160 may include a triamine derivative, a carbazole biphenyl derivative, an arylenediamine derivative, or an aluminum quinorium composite (Alq3).

The first capping layer 160 may be formed of a mixture of a high refractive index material and a low refractive index material. For example, the first capping layer 160 may include two layers having different refractive indices, for example, a high refractive index layer and a low refractive index layer.

In an embodiment, the first capping layer 160 may completely cover or overlap the cathode electrode CE. In an embodiment, as illustrated in FIG. 12, an end portion of the first capping layer 160 may be positioned relatively outside as compared to an end portion of the cathode electrode CE, and the end portion of the cathode electrode CE may be completely covered or overlapped by the first capping layer 160.

An encapsulation layer 170 may be disposed on the first capping layer 160. The encapsulation layer 170 protects components positioned below the encapsulation layer 170, for example, the light emitting devices ED1, ED2, and ED3 from external foreign substances such as moisture. The encapsulation layer 170 is commonly disposed in the first light emitting area LA1, the second light emitting area LA2, the third light emitting area LA3, and the non-light emitting area NLA. In an embodiment, the encapsulation layer 170 may cover or directly cover or overlap the cathode electrode CE. In an embodiment, a capping layer (not illustrated) covering or overlapping the cathode electrode CE may be further disposed between the encapsulation layer 170 and the cathode electrode CE, and the encapsulation layer 170 may cover or directly cover or overlap the capping layer. The encapsulation layer 170 may be a thin film encapsulation layer.

In an embodiment, the encapsulation layer 170 may include a lower inorganic layer 171, an organic layer 173, and an upper inorganic layer 175 sequentially stacked each other on the first capping layer 160.

In an embodiment, the lower inorganic layer 171 may cover or overlap the first light emitting device ED1, the second light emitting device ED2, and the third light emitting device ED3 in the display area DA. The lower inorganic layer 171 may cover or overlap the dam member DM in the non-display area NDA and may extend to the outside of the dam member DM.

In an embodiment, the lower inorganic layer 171 may completely cover or overlap the first capping layer 160. In an embodiment, an end portion of the lower inorganic layer 171 may be positioned relatively outside as compared to an end portion of the first capping layer 160, and the end portion of the first capping layer 160 may be completely covered or overlapped by the lower inorganic layer 171.

The lower inorganic layer 171 may include stacked layers. A more detailed structure of the lower inorganic layer 171 will be described later.

The organic layer 173 may be positioned on the lower inorganic layer 171. The organic layer 173 may cover or overlap the first light emitting device ED1, the second light emitting device ED2, and the third light emitting device ED3 in the display area DA. In an embodiment, a portion of the organic layer 173 may be positioned in the non-display area NDA, but may not be positioned outside the dam member DM. A portion of the organic layer 173 is illustrated as being positioned inside the first dam D1, but is not limited thereto. In an embodiment, a portion of the organic layer 173 may be accommodated in a space between the first dam D1 and the second dam D2, and an end portion of the organic layer 173 may also be positioned in an area between the first dam D1 and the second dam D2.

The upper inorganic layer 175 may be positioned on the organic layer 173. The upper inorganic layer 175 may cover or overlap the organic layer 173. In an embodiment, the upper inorganic layer 175 may be in direct contact with the lower inorganic layer 171 in the non-display area NDA to form an inorganic-inorganic junction. In an embodiment, an end portion of the upper inorganic layer 175 and an end portion of the lower inorganic layer 171 may be substantially aligned. The upper inorganic layer 175 may include stacked layers. A more detailed structure of the upper inorganic layer 175 will be described later.

In an embodiment, each of the lower inorganic layer 171 and the upper inorganic layer 175 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, or the like within the spirit and the scope of the disclosure.

In an embodiment, the organic layer 173 may be made of an acrylic resin, a methacrylic-based resin, polyisoprene, a vinyl-based resin, an epoxy-based resin, a urethane-based resin, a cellulose-based resin, a perylene-based resin, or the like within the spirit and the scope of the disclosure.

Hereinafter, the color conversion substrate 30 will be described with further reference to FIGS. 13 to 16 in addition to FIGS. 1 to 12.

Figure 13:
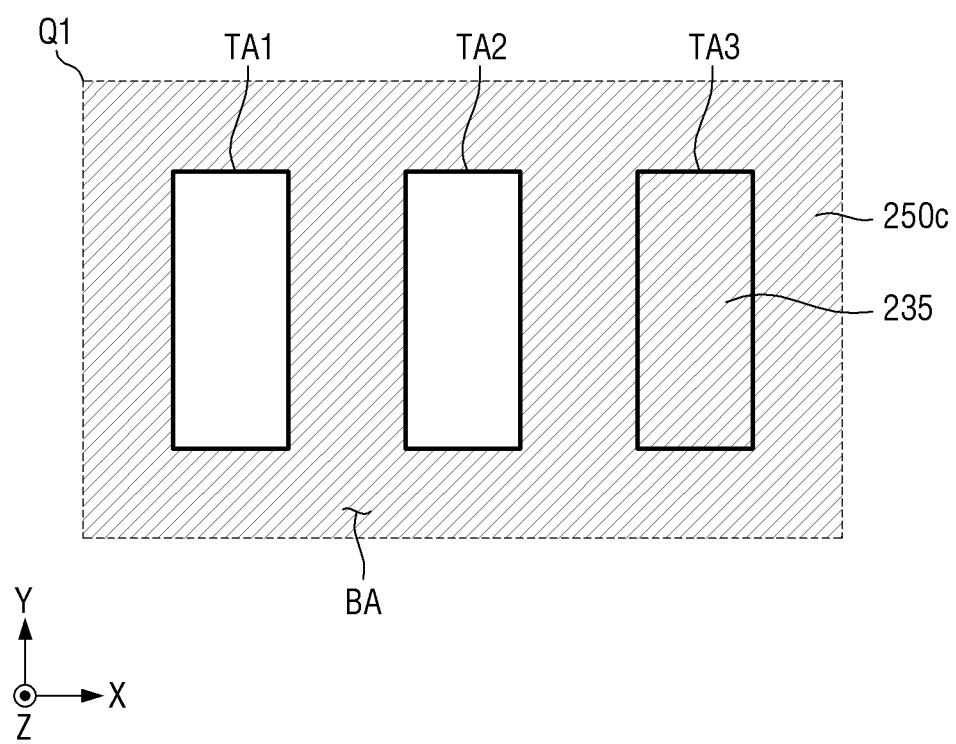
FIG. 13 is a schematic plan view illustrating a schematic arrangement of a third color filter in the color conversion substrate of the display device according to an embodiment.
Figure 14:
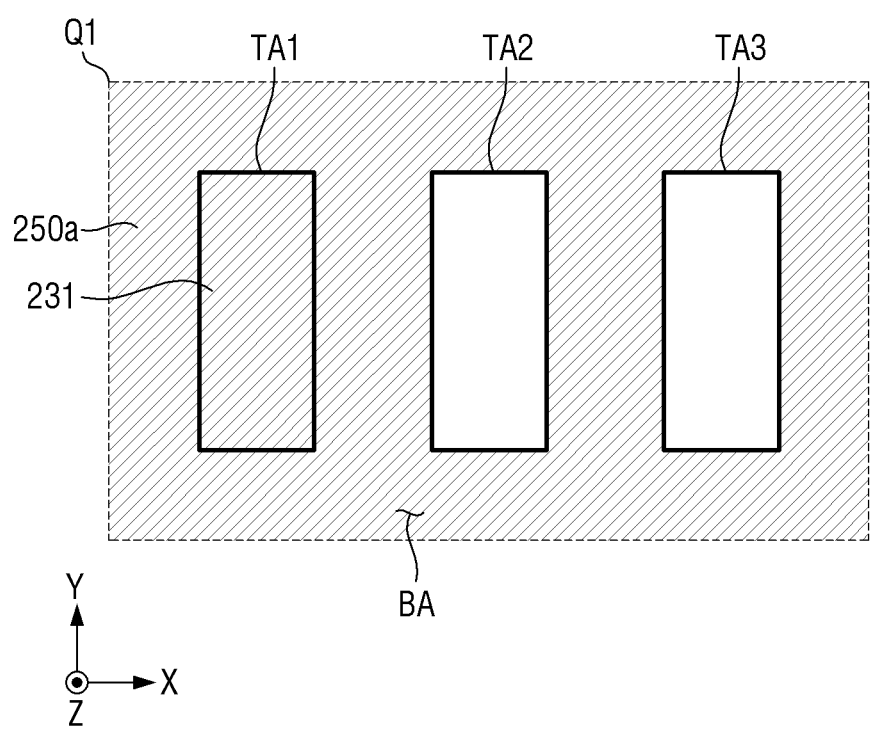
FIG. 14 is a schematic plan view illustrating a schematic arrangement of a first color filter in the color conversion substrate of the display device according to an embodiment.
Figure 15:
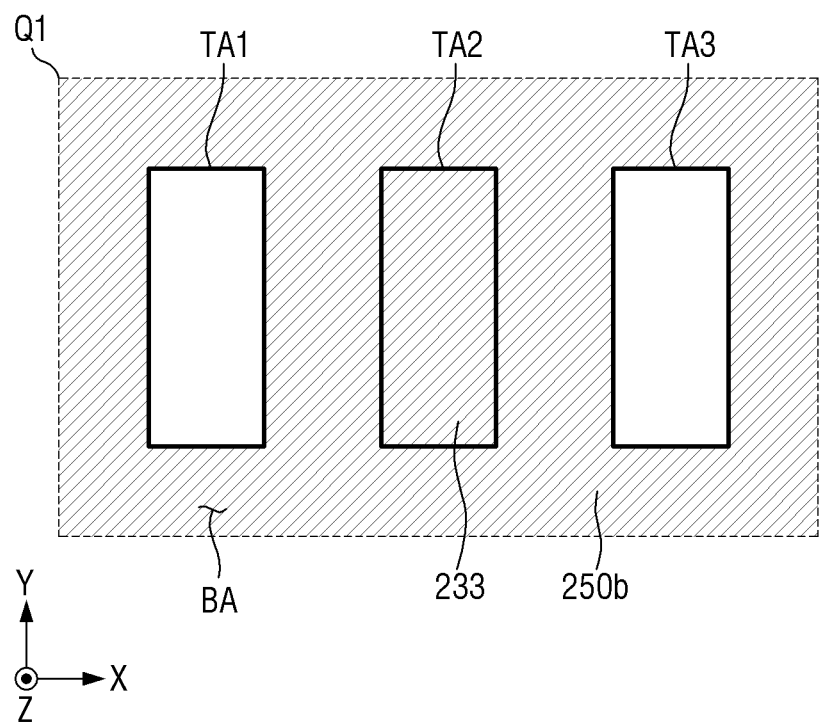
FIG. 15 is a schematic plan view illustrating a schematic arrangement of a second color filter in the color conversion substrate of the display device according to an embodiment.
Figure 16:
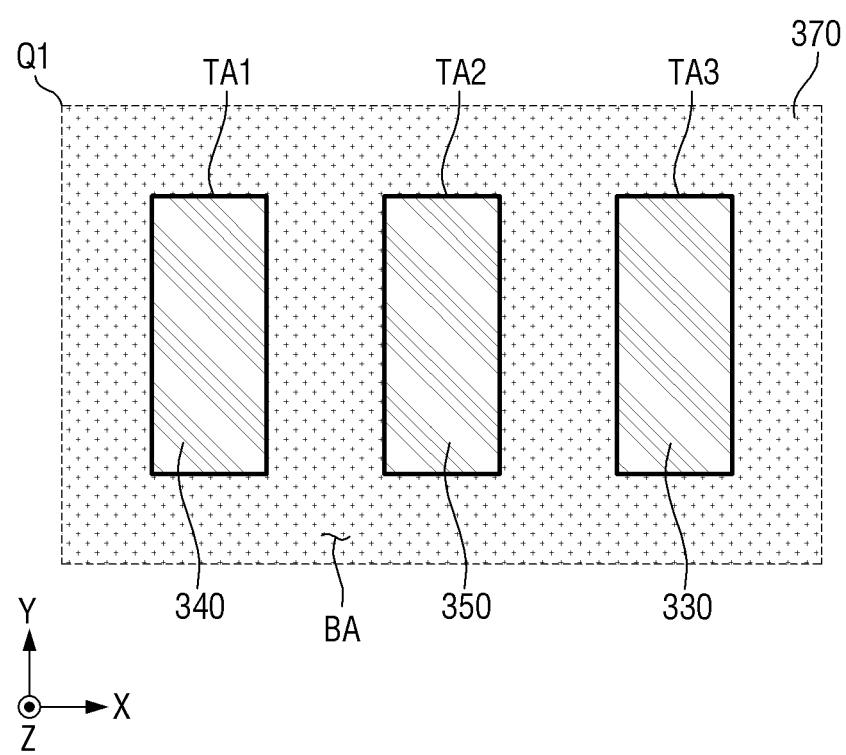
FIG. 16 is a schematic plan view illustrating a schematic arrangement of a bank pattern, a first wavelength conversion pattern, a second wavelength conversion pattern, and a light transmission pattern in the color conversion substrate of the display device according to an embodiment.

FIG. 13 is a schematic plan view illustrating a schematic arrangement of a third color filter in the color conversion substrate of the display device according to an embodiment. FIG. 14 is a schematic plan view illustrating a schematic arrangement of a first color filter in the color conversion substrate of the display device according to an embodiment. FIG. 15 is a schematic plan view illustrating a schematic arrangement of a second color filter in the color conversion substrate of the display device according to an embodiment. FIG. 16 is a schematic plan view illustrating a schematic arrangement of a bank pattern, a first wavelength conversion pattern, a second wavelength conversion pattern, and a light transmission pattern in the color conversion substrate of the display device according to an embodiment.

A second base portion 310 illustrated in FIGS. 9 and 12 may be made of a translucent material.

In an embodiment, the second base portion 310 may include a glass substrate or a plastic substrate. In an embodiment, the second base portion 310 may further include a separate layer positioned on the glass substrate or the plastic substrate, for example, an insulating layer such as an inorganic film.

As described above, in an embodiment, the light transmitting areas TA1, TA2, and TA3 and the light blocking area BA may be defined in the second base portion 310. In case that the second base portion 310 may include the glass substrate, a refractive index of the second base portion 310 may be about 1.5.

As illustrated in FIGS. 9 and 12, a color filter layer may be disposed on one surface or a surface of the second base portion 310 facing the display substrate 10. The color filter layer may include color filters 231, 233, and 235 and a light blocking pattern 250.

As illustrated in FIGS. 9, 12, and 13 to 15, the color filters 231, 233, and 235 may be disposed to overlap the light transmitting areas TA1, TA2, and TA3, respectively. The light blocking pattern 250 may be disposed to overlap the light blocking area BA. The first color filter 231 may overlap the first light transmitting area TA1, the second color filter 233 may overlap the second light transmitting area TA2, and the third color filter 235 may overlap the third light transmitting area TA3. The light blocking pattern 250 may be disposed to overlap the light blocking area BA to block light transmission. In an embodiment, the light blocking pattern 250 may be disposed in a substantially grid shape in a plan view.

In an embodiment, the light blocking pattern 250 may include a first light blocking pattern portion 250c on one surface or a surface of the second base portion 310, a second light blocking pattern portion 250a on the first light blocking pattern portion 250c, and a third light blocking pattern portion 250b on the second light blocking pattern portion 250a. The first light blocking pattern portion 250c may include a same material or a similar material as the third color filter 235, the second light blocking pattern portion 250a may include a same material or a similar material as the first color filter 231, and the third light blocking pattern portion 250b may include a same material or a similar material as the second color filter 233. For example, the light blocking pattern 250 may include a structure in which the first light blocking pattern portion 250c, the second light blocking pattern portion 250a, and the third light blocking pattern portion 250b may be sequentially stacked from one surface or a surface of the second base portion 310 on the light blocking area BA. In the case in which the light blocking pattern 250 has a structure in which the first light blocking pattern portion 250c, the second light blocking pattern portion 250a, and the third light blocking pattern portion 250b may be sequentially stacked from one surface or a surface of the second base portion 310 on the light blocking area BA, in case that external light is incident on the light blocking area BA, all of the light of the first color and the light of the second color except for the light of the third color are absorbed by the first light blocking pattern portion 250c while passing through the first light blocking pattern portion 250c, and the light of the third color may also be absorbed while passing through the second and third light blocking pattern portions 250a and 250b. However, although not illustrated, some light not transmitted by the first light blocking pattern portion 250c and reflected to the outside at an interface between the first light blocking pattern portion 250c and the second base portion 310 may exist. The light may be the light of the third color.

In other embodiments, the light blocking pattern 250 may include an organic light blocking material, and may be formed by a coating process, an exposing process, and the like, of the organic light blocking material. For example, the organic light blocking material may include a black matrix.

In an embodiment, the second light blocking pattern portion 250a may include a same material or a similar material as the first layer 231b of the first color filter 231, and may be formed through a same process as the first layer 231b.

The first color filter 231 may function as a blocking filter that blocks blue light and green light. In an embodiment, the first color filter 231 may selectively transmit the light of the first color (for example, red light) and may block or absorb the light of the second color (for example, green light) and the light of the third color (for example, blue light). For example, the first color filter 231 may be a red color filter and may include a red colorant. The first color filter 231 may include a base resin and a red colorant dispersed in the base resin. As will be described later, the first color filter 231 may include at least two layers. The at least two layers may include a first layer and a second layer between the first layer and the second base portion 310.

The second color filter 233 may function as a blocking filter that blocks blue light and red light. In an embodiment, the second color filter 233 may selectively transmits the light of the second color (for example, green light) and may block or absorb the light of the third color (for example, blue light) and the light of the first color (for example, red light). For example, the second color filter 233 may be a green color filter and may include a green colorant.

The third color filter 235 may selectively transmits the light of the third color (for example, blue light) and may block or absorb the light of the first color (for example, red light) and the light of the second color (for example, green light). In an embodiment, the third color filter 235 may be a blue color filter, and may include a blue colorant such as a blue dye or a blue pigment. In the specification, a colorant may include both a dye and a pigment.

In an embodiment, the light blocking pattern 250 may be omitted, and may also have a structure in which the above-described color filters 231, 233, and 235 may be stacked each other on the light blocking area BA.

As illustrated in FIGS. 9 and 12, a second capping layer 391 covering or overlapping the light blocking pattern 250, the first color filter 231, the second color filter 233, and the third color filter 235 may be positioned on one surface or a surface of the second base portion 310. In an embodiment, the second capping layer 391 may be in direct contact with the first color filter 231, the second color filter 233, and the third color filter 235. In an embodiment, the second capping layer 391 may also be in direct contact with the light blocking pattern 250.

The second capping layer 391 may prevent impurities such as moisture or air from penetrating from the outside to damage or contaminate the light blocking pattern 250, the color pattern 250, the first color filter 231, the second color filter 233, and the third color filter 235. The second capping layer 391 may prevent the color colorant included in the first color filter 231, the second color filter 233, and the third color filter 235 from diffusing into the configurations different from the first color filter 231, the second color filter 233, and the third color filter 235, for example, the first wavelength conversion pattern 340 and the second wavelength conversion pattern 350. In an embodiment, the second capping layer 391 may be made of an inorganic material. For example, the second capping layer 391 may include silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

In an embodiment, the second capping layer 391 may cover or overlap a side surface of the light blocking pattern 250 in the non-display area NDA. In an embodiment, the second capping layer 391 may be in direct contact with the second base portion 310 in the non-display area NDA.

A bank pattern 370 may be positioned on one surface or a surface of the second capping layer 391 facing the display substrate 10. In an embodiment, the bank pattern 370 may be positioned on or directly on one surface or a surface of the second capping layer 391 and may be in direct contact with the second capping layer 391.

In an embodiment, the bank pattern 370 may be disposed to overlap the non-light emitting area NLA or the light blocking area BA. In an embodiment, the bank pattern 370 may surround the first light transmitting area TA1, the second light transmitting area TA2, and the third light transmitting area TA3 in a plan view as illustrated in FIG. 16. The bank pattern 370 may partition a space in which a first wavelength conversion pattern 340, a second wavelength conversion pattern 350, and a light transmission pattern 330 are disposed.

In an embodiment, the bank pattern 370 may be formed as one pattern integrally connected as illustrated in FIG. 16, but is not limited thereto. In an embodiment, a portion surrounding the first light transmitting area TA1 of the bank pattern 370, a portion surrounding the second light transmitting area TA2 of the bank pattern 370, and a portion surrounding the third light transmitting area TA3 of the bank pattern 370 may also be individual patterns separated from each other.

In case that a first wavelength conversion pattern 340, a second wavelength conversion pattern 350, and a light transmission pattern 330 are formed by discharging an ink composition using a nozzle, for example, by an inkjet printing method, the bank pattern 370 may serve as a guide for stably positioning the discharged ink composition at a desired position. For example, the bank pattern 370 may function as a partition.

In an embodiment, the bank pattern 370 may overlap the pixel defining layer 150.

As illustrated in FIG. 12, in an embodiment, the bank pattern 370 may be further positioned in the non-display area NDA. The bank pattern 370 may overlap the light blocking pattern 250 in the non-display area NDA.

In an embodiment, the bank pattern 370 may include an organic material having photocurability. In an embodiment, the bank pattern 370 may include an organic material having photocurability and including a light blocking material. In case that the bank pattern 370 has a light blocking property, it is possible to prevent light from penetrating between the light emitting areas adjacent to each other in the display area DA. For example, the bank pattern 370 may prevent the emitted light LE emitted from the second light emitting device ED2 from being incident on the first wavelength conversion pattern 340 overlapping the first light emitting area LA1. The bank pattern 370 may block or prevent external light from penetrating into the components positioned below the bank pattern 370 in the non-light emitting area NLA and the non-display area NDA.

As illustrated in FIGS. 9 and 12, the first wavelength conversion pattern 340, the second wavelength conversion pattern 350, and the light transmission pattern 330 may be positioned on the second capping layer 391. In an embodiment, the first wavelength conversion pattern 340, the second wavelength conversion pattern 350, and the light transmission pattern 330 may be positioned in the display area DA.

The light transmission pattern 330 may overlap the third light emitting area LA3 or the third light emitting device ED3. The light transmission pattern 330 may be positioned in a space partitioned by the bank pattern 370 in the third light transmitting area TA3.

In an embodiment, the light transmission pattern 330 may have an island shape pattern as illustrated in FIG. 16. Although the drawing illustrates that the light transmission pattern 330 does not overlap the light blocking area BA, this is only an example. In other embodiments, a portion of the light transmission pattern 330 may overlap the light blocking area BA.

The light transmission pattern 330 may transmit incident light. As described above, the emitted light LE provided from the third light emitting device ED3 may be the blue light. The emitted light LE, which is the blue light, passes through the light transmission pattern 330 and the third color filter 235 and is emitted to the outside of the display device 1. For example, the third light emitted from the third light emitting area LA3 to the outside of the display device 1 may be blue light.

In an embodiment, the light transmission pattern 330 may include a first base resin 331, and may further include a first scatterer 333 dispersed in the first base resin 331.

The first base resin 331 may be made of a material having high light transmittance. In an embodiment, the first base resin 331 may be made of an organic material. For example, the first base resin 331 may include an organic material such as an epoxy-based resin, an acrylic resin, a cardo-based resin, or an imide-based resin.

The first scatterer 333 may have a refractive index different from that of the first base resin 331, and may form an optical interface with the first base resin 331. For example, the first scatterers 333 may be light scattering particles. The first scatterer 333 is not particularly limited as long as it is a material that scatters at least a portion of transmitted light, but may be, for example, a metal oxide particle or an organic particle. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), or the like, and examples of a material of the organic particle may include an acrylic resin, a urethane-based resin, or the like within the spirit and the scope of the disclosure. The first scatterer 333 may scatter light in a random direction irrespective of an incident direction of the incident light without substantially converting a wavelength of the light passing through the light transmission pattern 330.

In an embodiment, the light transmission pattern 330 may be in direct contact with the second capping layer 391 and the bank pattern 370.

The first wavelength conversion pattern 340 may be disposed on the second capping layer 391, and may overlap the first light emitting area LA1, the first light emitting device ED1, or the first light transmitting area TA1.

In an embodiment, the first wavelength conversion pattern 340 may be positioned in the space partitioned by the bank pattern 370 in the first light transmitting area TA1.

In an embodiment, the first wavelength conversion pattern 340 may be formed in the form of an island pattern as illustrated in FIG. 16. Although the drawing illustrates that the first wavelength conversion pattern 340 does not overlap the light blocking area BA, this is only an example. In other embodiments, a portion of the first wavelength conversion pattern 340 may also overlap the light blocking area BA.

In an embodiment, the first wavelength conversion pattern 340 may be in direct contact with the second capping layer 391 and the bank pattern 370.

The first wavelength conversion pattern 340 may convert or shift a peak wavelength of the incident light to light having another specific or given peak wavelength and emit the light having another specific or given peak wavelength. In an embodiment, the first wavelength conversion pattern 340 may convert the emitted light LE provided from the first light emitting device ED1 into red light having a peak wavelength in a range of about 610 nm to about 650 nm, and emit the above-described red light.

In an embodiment, the first wavelength conversion pattern 340 may include a second base resin 341 and a first wavelength shifter 345 dispersed in the second base resin 341, and may further include a second scatterer 343 dispersed in the second base resin 341.

The second base resin 341 may be made of a material having high light transmittance. In an embodiment, the second base resin 341 may be made of an organic material. In an embodiment, the second base resin 341 may be made of a same material or a similar material as the first base resin 331, or may include at least one of the materials for example as the constituent materials of the first base resin 331.

The first wavelength shifter 345 may convert or shift the peak wavelength of the incident light to another specific or given peak wavelength. In an embodiment, the first wavelength shifter 345 may convert the emitted light LE of the third color, which is the blue light provided from the first light emitting device ED1, into red light having a single peak wavelength in the range of about 610 nm to about 650 nm, and emit the above-described red light.

The first wavelength shifter 345 may be, for example, a quantum dot, a quantum bar, or a phosphor. For example, the quantum dot may be particulate matter that emits a specific or given color as electrons transition from a conduction band to a valence band.

The quantum dot may be a semiconductor nanocrystal material. The quantum dot may have a specific or given bandgap according to its composition and size to absorb light and emit light having a unique wavelength. Examples of semiconductor nanocrystals of the quantum dot may include group IV nanocrystals, group II-VI compound nanocrystals, group III-V compound nanocrystals, group IV-VI compound nanocrystals, or combinations thereof.

A group II-VI compound may be selected from the group consisting of a binary compound selected from the group consisting of CdSe, CdTe, ZnS, ZnSe, ZnTe, ZnO, HgS, HgSe, HgTe, MgSe, MgS, and mixtures thereof; a ternary compound selected from the group consisting of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

A group III-V compound may be selected from the group consisting of a binary compound selected from the group consisting of GaN, GaP, GaAs, GaSb, AlN, AlP, AlAs, AlSb, InN, InP, InAs, InSb, and mixtures thereof; a ternary compound selected from the group consisting of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and mixtures thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPS, and mixtures thereof.

A group IV-VI compound may be selected from the group consisting of a binary compound selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe, and mixtures thereof; and a quaternary compound selected from the group consisting of SnPbSSe, SnPbSeTe, SnPbSTe, and mixtures thereof. A group IV element may be selected from the group consisting of Si, Ge, and mixtures thereof. A group IV compound may be a binary compound selected from the group consisting of SiC, SiGe, and mixtures thereof.

The binary compound, the ternary compound, or the quaternary compound may be present in a particle at a uniform concentration or may be present in the same particle in a state of partially different concentration distributions. The quantum dot may have a core/shell structure in which one quantum dot surrounds another quantum dot. An interface between a core and a shell may have a concentration gradient in which a concentration of element present in the shell decreases toward the center.

In an embodiment, the quantum dot may have a core-shell structure including a core including the above-described nanocrystals and a shell surrounding the core. The shell of the quantum dot may serve as a protective layer for maintaining semiconductor properties by preventing chemical modification of the core and/or a charging layer for imparting electrophoretic properties to the quantum dot. The shell may be a single layer or a multilayer. An interface between a core and a shell may have a concentration gradient in which a concentration of element present in the shell decreases toward the center. Examples of the shell of the quantum dot may include a metal or non-metal oxide, a semiconductor compound, or a combination thereof.

For example, the metal or non-metal oxide may be a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, $NiO$, or the like or a ternary compound such as $MgAl_2O_4$, $CoFe_2O_4$, $NiFe_2O_4$, $CoMn_2O_4$, or the like, but the disclosure is not limited thereto.

Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but the disclosure is not limited thereto.

The light emitted by the first wavelength shifter 345 may have an emission wavelength spectrum full width of half maximum (FWHM) of about 45 nm or less, or about 40 nm or less, or about 30 nm or less, and through this, color purity and color reproducibility of colors displayed by the display device 1 may be further improved. The light emitted by the first wavelength shifter 345 may be emitted in several directions regardless of the incident direction of the incident light. Through this, side visibility of the first color displayed in the first light transmitting area TA1 may be improved.

A portion of the emitted light LE provided from the first light emitting device ED1 may be emitted through the first wavelength conversion pattern 340 without being converted into red light by the first wavelength shifter 345. A component of the emitted light LE incident to the first color filter 231 without being converted by the first wavelength conversion pattern 340 may be blocked by the first color filter 231. On the other hand, the red light of the emitted light LE converted by the first wavelength conversion pattern 340 passes through the first color filter 231 and is emitted to the outside. For example, the first light emitted to the outside of the display device 1 through the first light transmitting area TA1 may be red light.

The second scatterer 343 may have a refractive index different from that of the second base resin 341, and may form an optical interface with the second base resin 341. For example, the second scatterers 343 may be light scattering particles. Other detailed descriptions of the second scatterer 343 are substantially the same as or similar to those of the first scatterer 333, and thus will be omitted.

The second wavelength conversion pattern 350 may be positioned in a space partitioned by the bank pattern 370 in the second light transmitting area TA2.

Figure 19:
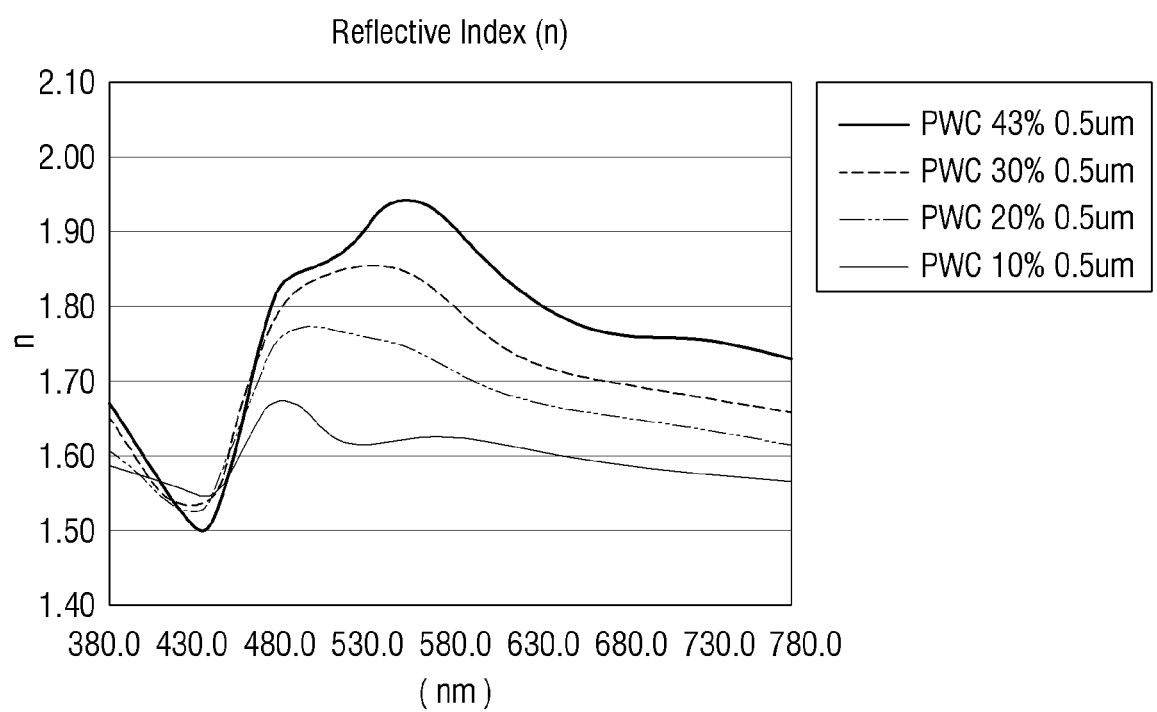
FIG. 19 is a graph illustrating a refractive index (n) of each wavelength according to the content of a first colorant.

In an embodiment, the second wavelength conversion pattern 350 may be formed in the form of an island pattern as illustrated in FIG. 19. In an embodiment, a portion of the second wavelength conversion pattern 350 may also overlap the light blocking area BA, unlike illustrated in the drawings.

In an embodiment, the second wavelength conversion pattern 350 may be in direct contact with the second capping layer 391 and the bank pattern 370.

The second wavelength conversion pattern 350 may convert or shift a peak wavelength of the incident light to light having another specific or given peak wavelength and emit the light having another specific or given peak wavelength. In an embodiment, the second wavelength conversion pattern 350 may convert the emitted light LE provided from the second light emitting device ED2 into green light having a range of about 510 nm to about 550 nm, and emit the above-described green light.

In an embodiment, the second wavelength conversion pattern 350 may include a third base resin 351 and a second wavelength shifter 355 dispersed in the third base resin 351, and may further include a third scatterer 353 dispersed in the third base resin 351.

The third base resin 351 may be made of a material having high light transmittance. In an embodiment, the third base resin 351 may be made of an organic material. In an embodiment, the third base resin 351 may be made of a same material or a similar material as the first base resin 331, or may include at least one of the materials for example as the constituent materials of the first base resin 331.

The second wavelength shifter 355 may convert or shift the peak wavelength of the incident light to another specific or given peak wavelength. In an embodiment, the second wavelength shifter 355 may convert blue light having a peak wavelength in a range of about 440 nm to about 480 nm into green light having a peak wavelength in a range of about 510 nm to about 550 nm.

The second wavelength shifter 355 may be, for example, a quantum dot, a quantum bar, or a phosphor. A more detailed description of the second wavelength shifter 355 is substantially the same as or similar to that described above in the description of the first wavelength shifter 345, and thus will be omitted.

In an embodiment, both the first wavelength shifter 345 and the second wavelength shifter 355 may be formed of quantum dots. A particle size of the quantum dots constituting the second wavelength shifter 355 may be smaller than a particle size of the quantum dots constituting the first wavelength shifter 345.

The third scatterer 353 may have a refractive index different from that of the third base resin 351, and may form an optical interface with the third base resin 351. For example, the third scatterers 353 may be light scattering particles. Other detailed descriptions of the third scatterer 353 are substantially the same as or similar to those of the second scatterer 343, and thus will be omitted.

The emitted light LE emitted from the third light emitting device ED3 may be provided to the second wavelength conversion pattern 350, and the second wavelength shifter 355 may convert the emitted light LE provided from the third light emitting device ED3 into green light having a peak wavelength in a range of about 510 nm to about 550 nm and emit the green light.

Some or a number of the emitted light LE, which is blue light, may pass through the second wavelength conversion pattern 350 without being converted into green light by the second wavelength shifter 355, which may be blocked by the second color filter 233. On the other hand, the green light of the emitted light LE converted by the second wavelength conversion pattern 350 passes through the second color filter 233 and is emitted to the outside. Accordingly, the second light emitted from the second light transmitting area TA2 to the outside of the display device 1 may be green light.

A third capping layer 393 may be positioned on the bank pattern 370, the light transmission pattern 330, the first wavelength conversion pattern 340, and the second wavelength conversion pattern 350. The third capping layer 393 may cover or overlap the light transmission pattern 330, the first wavelength conversion pattern 340, and the second wavelength conversion pattern 350. In an embodiment, the third capping layer 393 may also be positioned in the non-display area NDA. In the non-display area (NDA of FIG. 1), the third capping layer 393 may be in direct contact with the second capping layer 391, and may seal the light transmission pattern 330, the first wavelength conversion pattern 340, and the second wavelength conversion pattern 350. Accordingly, it is possible to prevent impurities such as moisture or air from penetrating from the outside to damage or contaminate the light transmission pattern 330, the first wavelength conversion pattern 340, and the second wavelength conversion pattern 350.

In an embodiment, the third capping layer 393 may cover or overlap an outer side surface of the bank pattern 370 in the non-display area NDA. The third capping layer 393 may be in direct contact with the second capping layer 391 in the non-display area NDA.

In an embodiment, the third capping layer 393 may be made of an inorganic material. In an embodiment, the third capping layer 393 may be made of a same material or a similar material as the second capping layer 391, or may include at least one of the materials mentioned in the description of the second capping layer 391. In case that both the second capping layer 391 and the third capping layer 393 are made of an inorganic material, the second capping layer 391 and the third capping layer 393 may be in direct contact with each other in the non-display area NDA to form an inorganic-inorganic junction.

As described above, the sealing member 50 may be positioned between the color conversion substrate 30 and the display substrate 10 in the non-display area NDA.

The sealing member 50 may overlap the encapsulation layer 170. By way of example, the sealing member 50 may overlap the lower inorganic layer 171 and the upper inorganic layer 175 and may not overlap the organic layer 173. In an embodiment, the sealing member 50 may be in direct contact with the encapsulation layer 170. By way of example, the sealing member 50 may be positioned on or directly on the upper inorganic layer 175 and in direct contact with the upper inorganic layer 175.

In an embodiment, the upper inorganic layer 175 and the lower inorganic layer 171 positioned under or below the sealing member 50 may extend to the outside of the sealing member 50, and an end portion of the upper inorganic layer 175 and an end portion of the lower inorganic layer 171 may be positioned between the sealing member 50 and a first portion of a first support member, and between the sealing member 50 and a second portion of the first support member.

The sealing member 50 may overlap the color pattern 250, the first color filter 231, and the bank pattern 370 in the non-display area NDA. In an embodiment, the sealing member 50 may be in direct contact with the third capping layer 393 covering or overlapping the bank pattern 370.

The sealing member 50 may overlap the first gate metal WR1 including a line connected to the connection pad PD. As the sealing member 50 is disposed to overlap the first gate metal WR1, a width of the non-display area NDA may be reduced.

As described above, the filler 70 may be positioned in the space between the color conversion substrate 30, the display substrate 10, and the sealing member 50. In an embodiment, the filler 70 may be in direct contact with the third capping layer 393 and the upper inorganic layer 175 of the encapsulation layer 170 as illustrated in FIGS. 9 and 12.

Hereinafter, the first color filter 231 according to an embodiment will be described in more detail.

Figure 17:
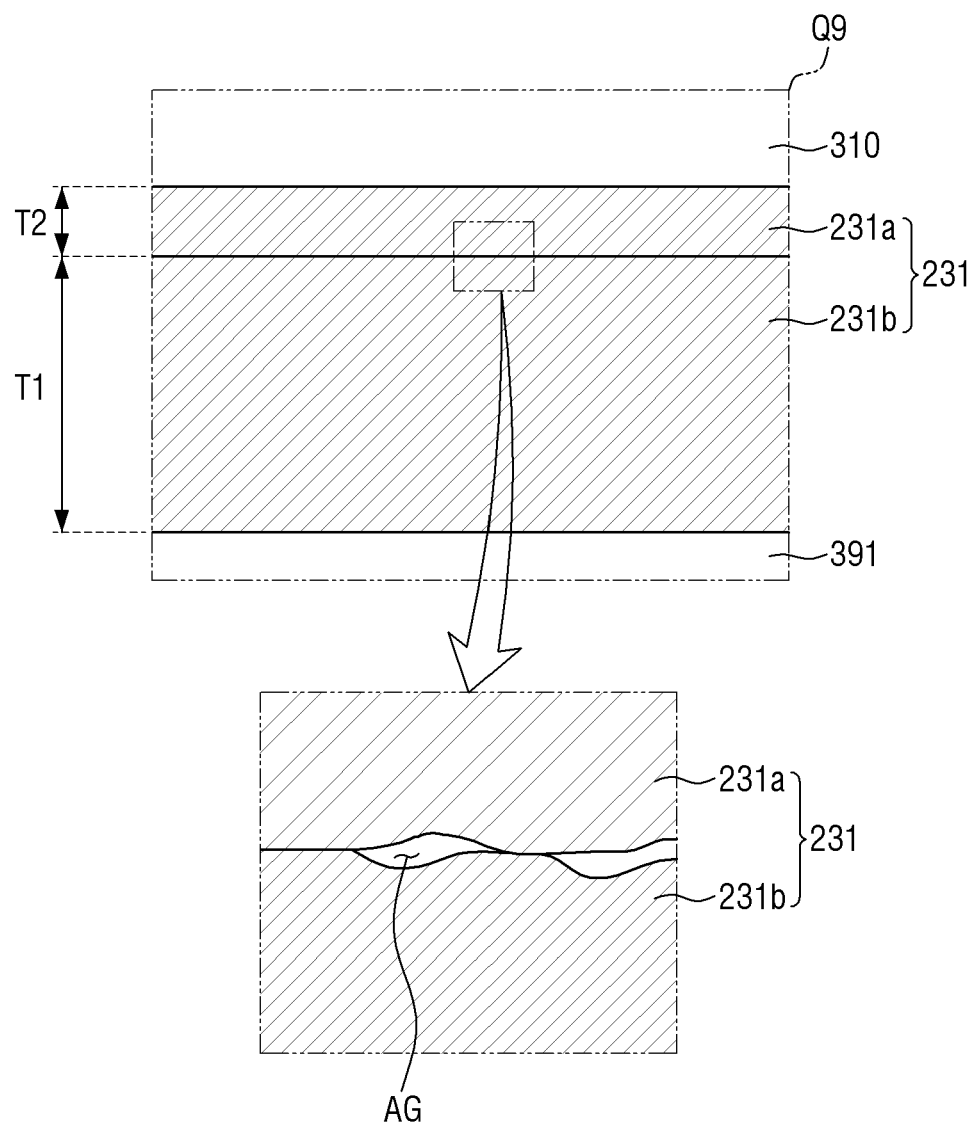
FIG. 17 is an enlarged schematic cross-sectional view of an area Q9 of FIG. 9.
Figure 18:
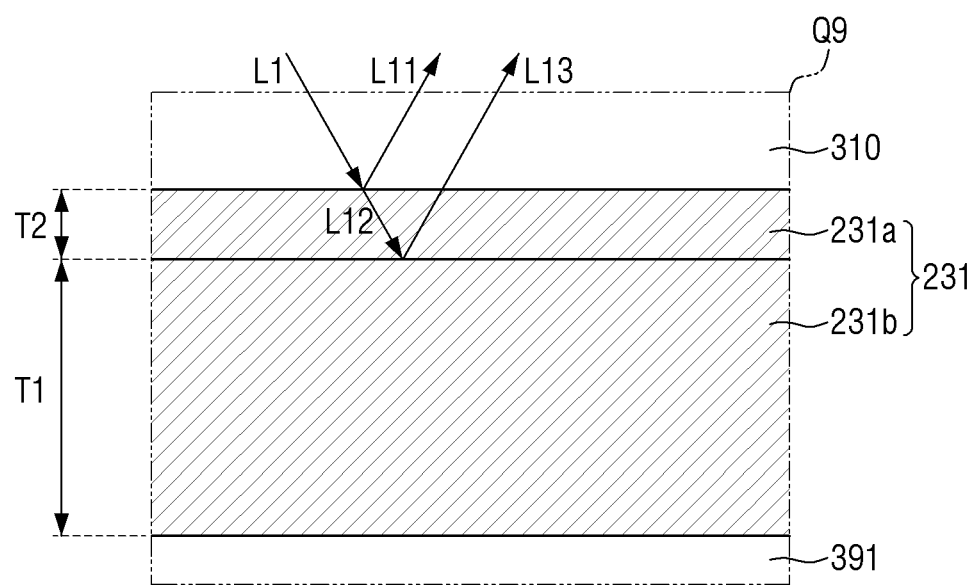
FIG. 18 is a schematic diagram illustrating a path of external light in a second base portion and a first color filter according to an embodiment.
Figure 20:
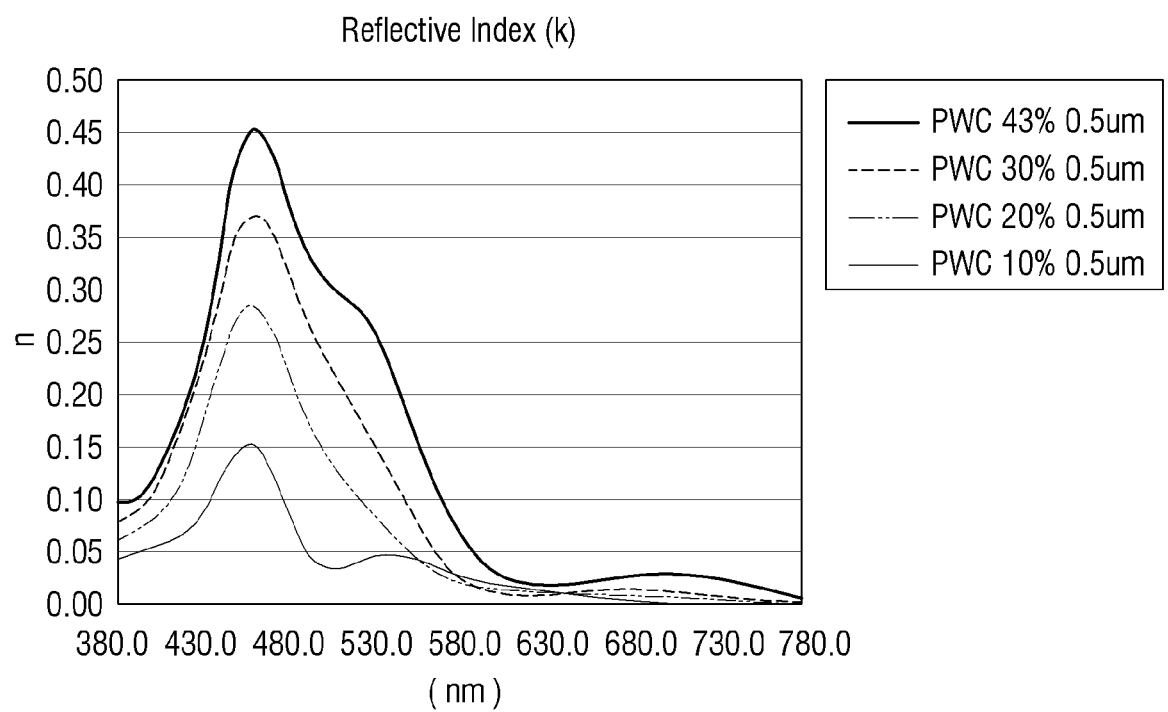
FIG. 20 is a graph illustrating a refractive index (k) of each wavelength according to the content of the first colorant.
Figure 21:
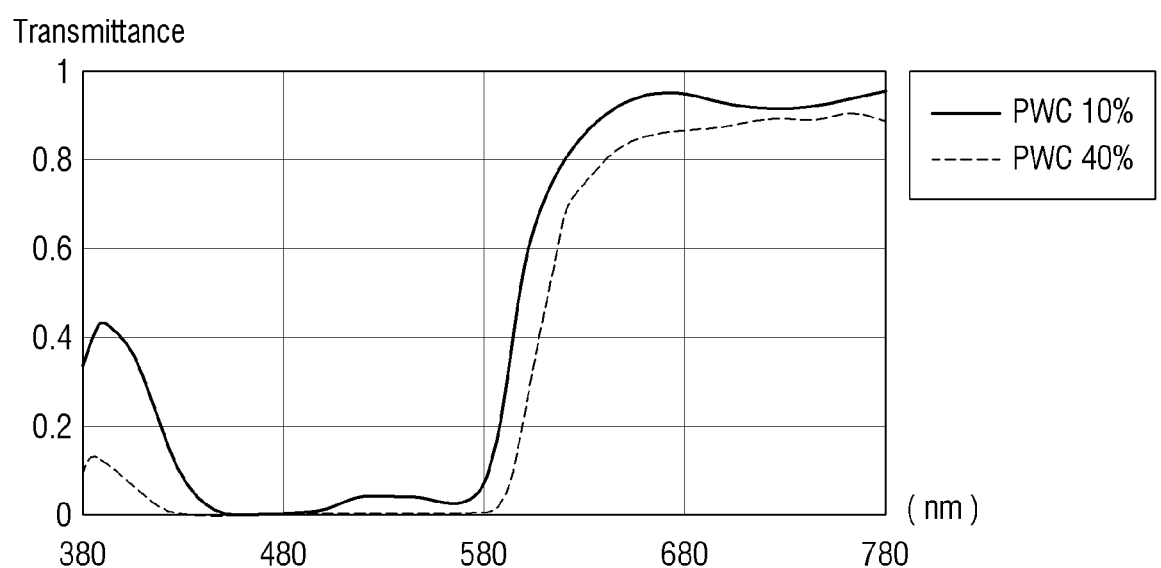
FIGS. 21 and 22 are graphs illustrating transmittance for each wavelength according to the content of the first colorant.
Figure 22:
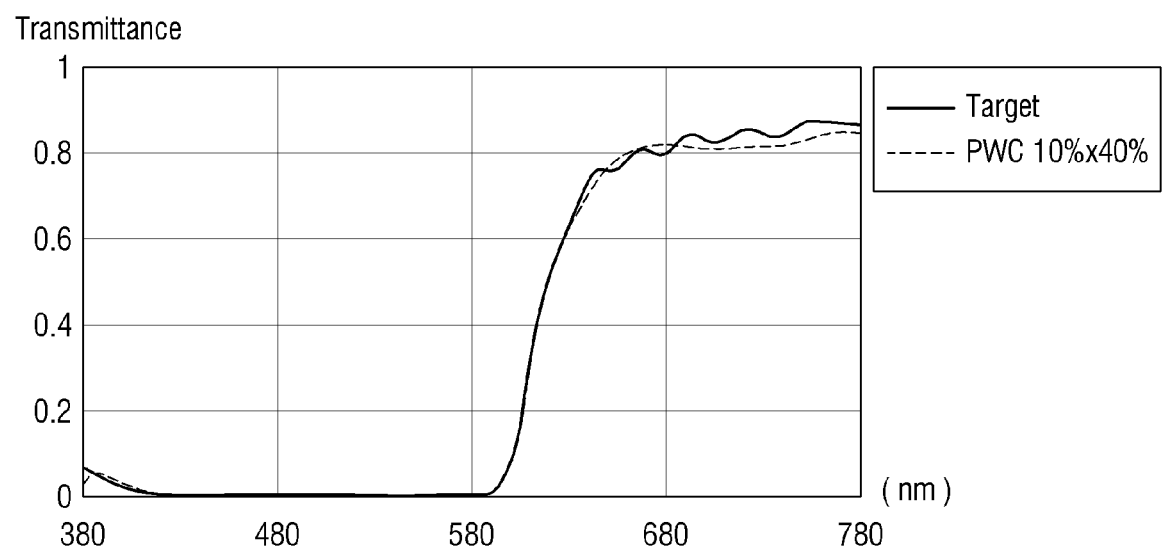

FIG. 17 is an enlarged schematic cross-sectional view of an area Q9 of FIG. 9. FIG. 18 is a schematic diagram illustrating a path of external light in a second base portion and a first color filter according to an embodiment. FIG. 19 is a graph illustrating a refractive index (n) of each wavelength according to the content of a first colorant. FIG. 20 is a graph illustrating a refractive index (k) of each wavelength according to the content of the first colorant. FIGS. 21 and 22 are graphs illustrating transmittance for each wavelength according to the content of the first colorant. FIGS. 19 and 20 illustrate refractive indices (n, k) for each wavelength according to the content of the first colorant of the first color filter.

Referring to FIG. 17, as described above, the first color filter 231 according to an embodiment may include at least two layers. The at least two layers may include a first layer 231b between the second capping layer 391 and the second base portion 310, and a second layer 231a between the first layer 231b and the second base portion 310. The first color filter 231 may include a base resin and a colorant dispersed in the base resin. The colorant may be red colorant. The first layer 231b may include the base resin and a first colorant of the colorant, and the second layer 231a may include the base resin and a second colorant of the colorant. The first layer 231b may be a layer distinct from the second layer 231a. For example, the first layer 231b and the second layer 231a may not be formed in a same process, but may be formed through a separate process. For example, after coating a second layer material layer on the second base portion 310, and coating a first layer material layer on the second layer material layer, the first layer 231b and the second layer 231a of FIG. 17 may be formed through exposure and development. In an embodiment, after forming the second layer 231a by coating the second layer material layer on the second base portion 310 through coating, exposure, and development, the first layer 231b may also be formed by forming the first layer material layer on the second layer 231a by an inkjet method. According to the above-described process, since the first layer 231b and the second layer 231a are distinct from each other, an air gap AG may be disposed at an interface between the first layer 231b and the second layer 231a as illustrated the enlarged view of FIG. 17.

The first colorant may be dispersed in the base resin of the first layer 231b in a first content, the second colorant may be dispersed in the base resin of the second layer 231a in a second content, and the first content may be greater than the second content. For example, the first content may be in a range of about 25% to about 45%, and the second content may be in a range of about 8% to about 15%.

As illustrated in FIGS. 19 and 20, it may be seen that the refractive indices (n, k) of the first color filter are generally higher as the content of the colorant PWC increases. The refractive indices (n, k) of the first color filter are related to a specular reflectance. For example, as the refractive indices (n, k) of the first color filter decrease, the specular reflectance of the first color filter may decrease. According to an embodiment, the second content of the second layer 231a close to the second base portion 310 to which external light is incident is in a range of about 8% to about 15%, whereas the first content of the first layer 231b is in a range of about 25% to about 45%, and as a result, the second layer 231a may function to lower the specular reflectance with respect to the external light incident from the second base portion 310. A refractive index (or first refractive index) of the first layer 231b due to the first content may be greater than a refractive index (or second refractive index) of the second layer 231a due to the second content. In other words, the refractive index of the second layer 231a may be smaller than the refractive index of the first layer 231b. The refractive index of the second layer 231a may be equal to or greater than that of the second base portion 310. The first refractive index may be in a range of about 1.65 to about 2.0, and the second refractive index may be in a range of about 1.5 to about 1.65.

The first layer 231b may have a first thickness T1, and the second layer 231a may have a second thickness T2 smaller than the first thickness T1. The first thickness T1 may be in a range of about 2000 nm to about 4000 nm, and the second thickness T2 may be in a range of about 500 nm to about 2000 nm.

As described above, the first color filter 231 needs to satisfy a color characteristic of selectively transmitting the light of the first color (for example, red light) and blocking or absorbing the light of the second color (for example, green light) and the light of the third color (for example, blue light). For example, as a criterion satisfying the color characteristic of the first color filter 231, (Rx, Ry, Rz) may be 0.6965, 0.3005, and 7.51, respectively, based on the CIE1931 color coordinate system. The coordinates of the CIE1931 color coordinate system of the first color filter 231 may be extracted through transmittance according to wavelength (nm) illustrated in FIGS. 21 to 22. Based on the CIE1931 color coordinate system, a graph in which (Rx, Ry, Rz) is 0.6965, 0.3005, and 7.51, respectively, may be a graph of the target of FIG. 22. As illustrated in FIGS. 21 and 22, it was confirmed that the case where the content of the first colorant was 40% (PWC 40%) is more consistent with the graph of the target compared to the case where the content of the first colorant was 10% (PWC 10%), and it was confirmed that the case where the content of the first colorant in the first layer is 40% and the content of the second colorant in the second layer is 10% (PWC 10%+PWC 40%) is more consistent with the graph of the target compared to the case where the content of the first colorant was 40% (PWC 40%).

As described above, the first content of the first layer 231*b* of the first color filter 231 according to an embodiment may be in a range of about 25% to about 45%, and the second content of the second layer 231*a* thereof may be in a range of about 8% to about 15%. As a result, it was confirmed that the color characteristic of the first color filter 231 may also be secured because the first content of the first layer 231*b* of the first color filter 231 according to an embodiment is in a range of about 25% to about 45%, and the second content of the second layer 231*a* thereof is in a range of about 8% to about 15%.

Further, as illustrated in FIG. 18, in case that the first light L1 is incident through the second base portion 310, a portion of the first light L1 is reflected (L11) at an interface between the second base portion 310 and the second layer 231*a*, and another portion may pass through (L12) the second layer 231*a* and be reflected (L13) at an interface between the first layer 231*b* and the second layer 231*a*. As described above, according to the display device according to an embodiment, since the second content of the second layer 231*a* is in a range of about 8% to about 15%, the degree to which the first light L1 is reflected (L11) at the interface between the second base portion 310 and the second layer 231*a* may be reduced. However, there is room for another portion of the first light L1 to pass through (L12) the second layer 231*a* and be reflected (L13) at the interface between the first layer 231*b* and the second layer 231*a*, and by designing the light transmittance of the second layer 231*a* according to an embodiment to be about 10% or less, the degree to which another portion of the first light L1 passes through (L12) the second layer 231*a* and is reflected (L13) at the interface between the first layer 231*b* and the second layer 231*a* may also be significantly reduced.

Although embodiments have been disclosed for illustrative purposes, those skilled in the art will appreciate that various modifications, additions and substitutions are possible, without departing from the scope and spirit of the disclosure and as disclosed in the accompanying claims.

What is claimed is:

1. A display device comprising:
a display area;
a non-display area;
a display substrate;
a color conversion substrate disposed on the display substrate, wherein
the display substrate includes:
a first base portion; and
a light emitting element disposed in the display area on the first base portion,
the color conversion substrate includes:
a second base portion facing the first base portion; and
a color filter layer disposed between the second base portion and the light emitting element,
the display area includes a first light emitting area emitting first light,
the color filter layer includes a first color filter disposed in the first light emitting area, and
the first color filter includes at least two layers, the at least two layers including a first layer and a second layer disposed between the first layer and the second base portion,
the first layer and the second layer are different from each other,
the first layer includes a first base resin and a first colorant dispersed in the first base resin, and
the second layer includes a second base resin and a second colorant dispersed in the second base resin.

2. The display device of claim 1, wherein the first light has a peak wavelength in a range of about 610 nm to about 650 nm.

3. The display device of claim 2, wherein the display area includes:
a second light emitting area emitting second light;
a third light emitting area emitting third light; and
a non-light emitting area partitioning the first light emitting area, the second light emitting area, and the third light emitting area.

4. The display device of claim 3, wherein
the second light has a peak wavelength in a range of about 510 nm to about 550 nm, and
the third light has a peak wavelength in a range of about 440 nm to about 480 nm.

5. The display device of claim 4, wherein the color filter layer includes:
a second color filter disposed in the second light emitting area; and
a third color filter disposed in the third light emitting area.

6. The display device of claim 5, wherein the first color filter includes more layers than each of the second color filter and the third color filter.

7. The display device of claim 1, wherein
the first colorant is dispersed in the first base resin of the first layer in a first content,
the second colorant is dispersed in the second base resin of the second layer in a second content, and
the first content is greater than the second content.

8. The display device of claim 7, wherein the first content is in a range of about 25% to about 45%.

9. The display device of claim 8, wherein the second content is in a range of about 8% to about 15%.

10. The display device of claim 1, wherein the first layer has a first thickness, and the second layer has a second thickness less than the first thickness of the first layer.

11. The display device of claim 10, wherein the first thickness is in a range of about 2000 nm to about 4000 nm.

12. The display device of claim 11, wherein the second thickness is in a range of about 500 nm to about 2000 nm.

13. The display device of claim 1, wherein the color filter layer includes a light blocking pattern overlapping the non-light emitting area, the light blocking pattern includes: a first light blocking pattern disposed on a surface of the second base portion; a second light blocking pattern disposed on the first light blocking pattern; and a third light blocking pattern disposed on the second light blocking pattern, the first light blocking pattern and the third color filter include a same material, the second light blocking pattern and the first layer of the first color filter include a same material, and the third light blocking pattern and the second color filter include a same material.

14. A display device comprising:
a display area;
a non-display area;
a first substrate;
a second substrate disposed on the first substrate, wherein
the first substrate includes:
  a first base portion; and
  a light emitting element disposed in the display area on the first base portion,
the second substrate includes:
  a second base portion facing the first base portion; and
  a color filter layer disposed between the second base portion and the light emitting element,
the display area includes a first light emitting area emitting first light,
the color filter layer includes a first color filter disposed in the first light emitting area,
the first color filter includes at least two layers,
the first color filter includes a base resin and a colorant dispersed in the base resin,
the at least two layers of the first color filter include:
  a first layer; and
  a second layer disposed between the first layer and the second base portion,
the first layer and the second layer are different from each other,
the first layer has a first refractive index, and
the second layer has a second refractive index smaller than the first refractive index of the first layer,
wherein the second layer has a transmittance of about 10% or less for a wavelength in a range of about 480 nm to about 580 nm.

15. The display device of claim 14, wherein
the second base portion has a third refractive index, and
the second refractive index is greater than or equal to the third refractive index of the second base portion.

16. The display device of claim 15, wherein
the first refractive index is in a range of about 1.65 to about 2.0, and
the second refractive index is in a range of about 1.5 to about 1.65.

17. The display device of claim 14, wherein the second substrate includes wavelength conversion patterns and a light transmission pattern disposed between the color filter layer and the light emitting element.

* * * * *